(12) United States Patent
Hayashi

(10) Patent No.: US 10,566,437 B2
(45) Date of Patent: Feb. 18, 2020

(54) THIN FILM TRANSISTOR AND ARRAY SUBSTRATE

(71) Applicant: Mitsubishi Electric Corporation, Tokyo (JP)

(72) Inventor: Masami Hayashi, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/241,760

(22) Filed: Aug. 19, 2016

(65) Prior Publication Data

US 2017/0062580 A1 Mar. 2, 2017

(30) Foreign Application Priority Data

Aug. 25, 2015 (JP) ................. 2015-165463

(51) Int. Cl.
*H01L 29/786* (2006.01)
*H01L 29/49* (2006.01)
(Continued)

(52) U.S. Cl.
CPC ...... *H01L 29/4908* (2013.01); *H01L 27/1225* (2013.01); *H01L 27/1237* (2013.01);
(Continued)

(58) Field of Classification Search
CPC ............. H01L 51/0516; H01L 51/0529; H01L 29/4908; H01L 51/0508; H01L 51/0512;
(Continued)

(56) References Cited

U.S. PATENT DOCUMENTS 8,624,240 B2 1/2014 Sato et al.
8,860,023 B2 10/2014 Tsubuku et al.
(Continued)

FOREIGN PATENT DOCUMENTS

JP 2007-220817 A 8/2007
JP 2012-033836 A 2/2012
(Continued)

OTHER PUBLICATIONS

Tokiyoshi Matsuda et al. "Sheet resistance and crystallinity of Ga- and Al-implanted zinc oxide thin films with postannealing", Jul./Aug. 2007, Journal of Vacuum Science & Technology A: Vacuum, Surfaces, and Films, vol. 25(4), pp. 706-710.*
(Continued)

*Primary Examiner* — Allen L Parker
*Assistant Examiner* — Pauline Vu
(74) *Attorney, Agent, or Firm* — Studebaker & Brackett PC

(57) ABSTRACT

A first oxide semiconductor region serving as a channel region of a TFT is formed on a first insulating region of a gate insulating film whose hydrogen content is comparatively low, and a second oxide semiconductor region that contacts with a source electrode and a drain electrode is formed on a second insulating region of a gate insulating film whose hydrogen content is comparatively high. For this reason, sheet resistance R1 of the first oxide semiconductor region is comparatively high, and sheet resistance R3 of the second oxide semiconductor region is comparatively low so that R1>R3.

6 Claims, 21 Drawing Sheets

(51) Int. Cl.
*H01L 27/12* (2006.01)
*H01L 29/417* (2006.01)
*H01L 29/423* (2006.01)

(52) U.S. Cl.
CPC .. *H01L 29/41725* (2013.01); *H01L 29/41733* (2013.01); *H01L 29/42384* (2013.01); *H01L 29/786* (2013.01); *H01L 29/7869* (2013.01); *H01L 29/78696* (2013.01); *H01L 2029/42388* (2013.01)

(58) Field of Classification Search
CPC ............... H01L 29/786; H01L 29/7869; H01L 29/42364; H01L 29/42368; H01L 2029/42388; H01L 29/42384; H01L 29/78693; H01L 29/78696; H01L 29/512; H01L 29/513; H01L 29/41725; H01L 29/41733; H01L 27/1225; H01L 27/1237
See application file for complete search history.

(56) References Cited

U.S. PATENT DOCUMENTS

| | | | |
|---|---|---|---|
| 8,963,147 B2 | 2/2015 | Imamura et al. | |
| 9,012,904 B2 | 4/2015 | Imoto et al. | |
| 9,035,305 B2 | 5/2015 | Tsubuku et al. | |
| 9,281,407 B2 | 3/2016 | Tsubuku et al. | |
| 2001/0020994 A1* | 9/2001 | Kaneko | G02F 1/136286 349/147 |
| 2009/0014722 A1* | 1/2009 | Doi | H01L 27/1214 257/59 |
| 2010/0159639 A1* | 6/2010 | Sakata | H01L 21/02565 438/104 |
| 2010/0237355 A1* | 9/2010 | Moriguchi | H01L 29/66757 257/72 |
| 2010/0295047 A1* | 11/2010 | Moriguchi | H01L 29/66757 257/57 |
| 2011/0198603 A1* | 8/2011 | Choi | H01L 27/1214 257/66 |
| 2011/0285640 A1* | 11/2011 | Park | G02F 1/13338 345/173 |
| 2011/0309355 A1* | 12/2011 | Ichijo | H01L 29/4908 257/43 |
| 2012/0112182 A1* | 5/2012 | Ishii | H01L 29/4908 257/43 |
| 2012/0193620 A1* | 8/2012 | Godo | H01L 29/7869 257/43 |
| 2012/0241737 A1* | 9/2012 | Imoto | H01L 29/78603 257/43 |
| 2012/0286282 A1* | 11/2012 | Sugawara | H01L 29/66765 257/72 |
| 2013/0299819 A1* | 11/2013 | Yamazaki | H01L 29/7869 257/43 |
| 2014/0035478 A1* | 2/2014 | Kitakado | H01L 29/7869 315/210 |
| 2014/0284594 A1* | 9/2014 | Nakano | H01L 27/1237 257/43 |
| 2015/0171113 A1* | 6/2015 | Honjo | H01L 27/1222 257/72 |
| 2015/0221496 A1* | 8/2015 | Tai | H01L 29/78606 438/104 |
| 2015/0371906 A1* | 12/2015 | Kishi | H01L 29/66969 257/43 |
| 2016/0322507 A1* | 11/2016 | Choi | H01L 29/78606 |

FOREIGN PATENT DOCUMENTS

| | | |
|---|---|---|
| JP | 2012-216792 A | 11/2012 |
| JP | 2014-199896 A | 10/2014 |
| WO | 2012/043338 A1 | 4/2012 |

OTHER PUBLICATIONS

An Office Action mailed by the Japanese Patent Office dated Jun. 4, 2019, which corresponds to Japanese Patent Application No. 2015-165463 and is related to U.S. Appl. No. 15/241,760.

* cited by examiner

F I G. 3
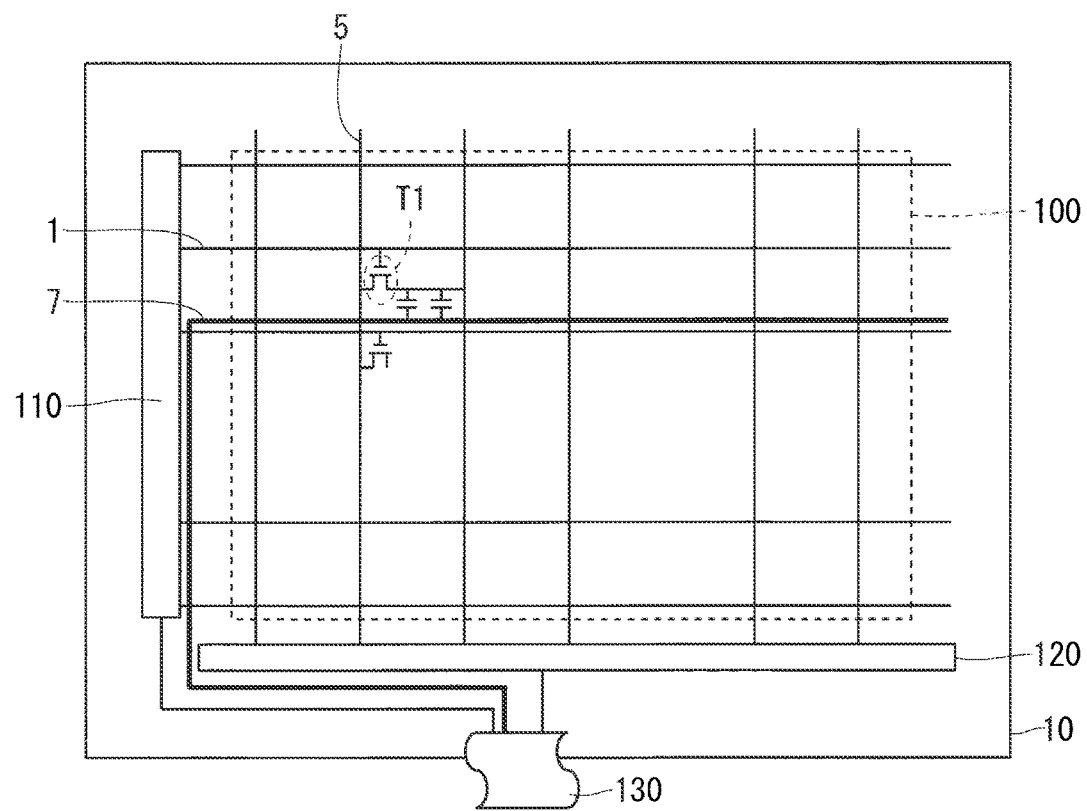

F I G. 4
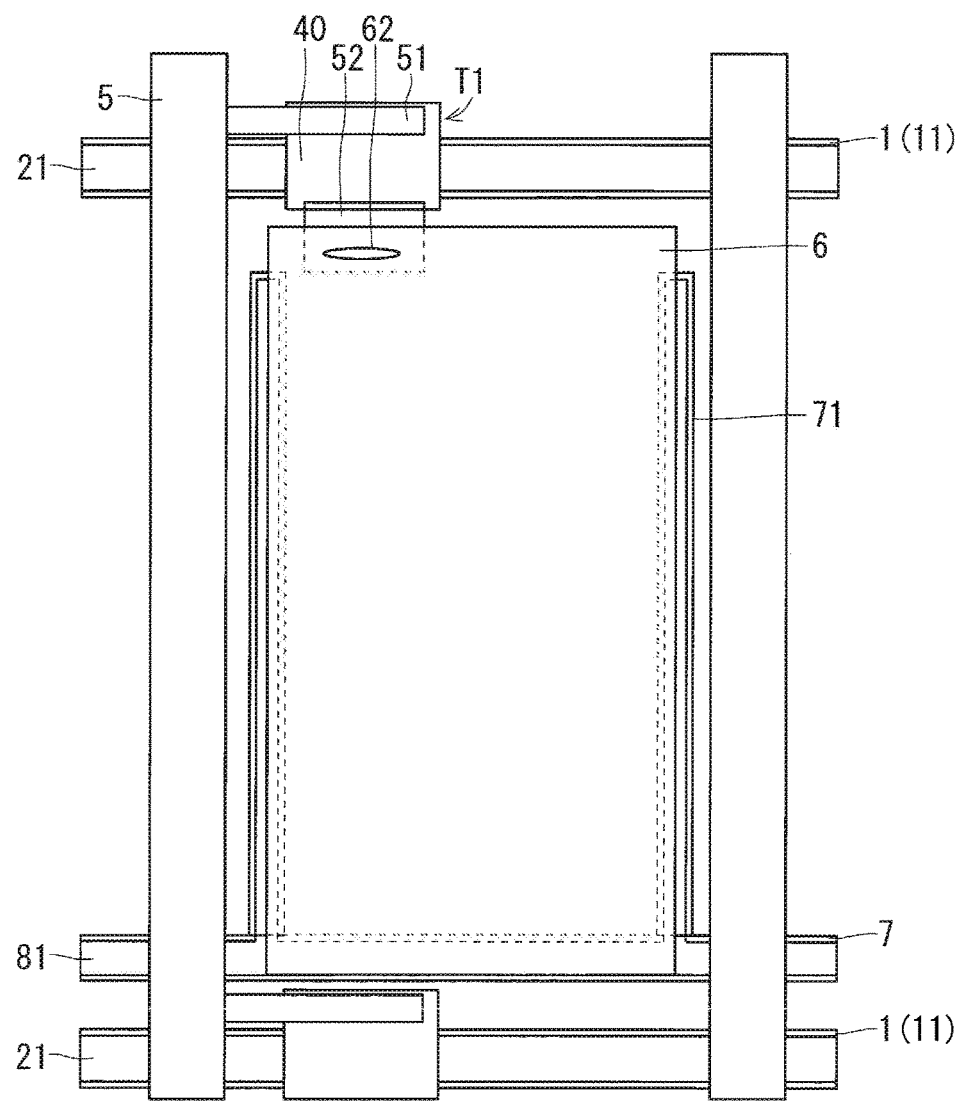

F I G. 5
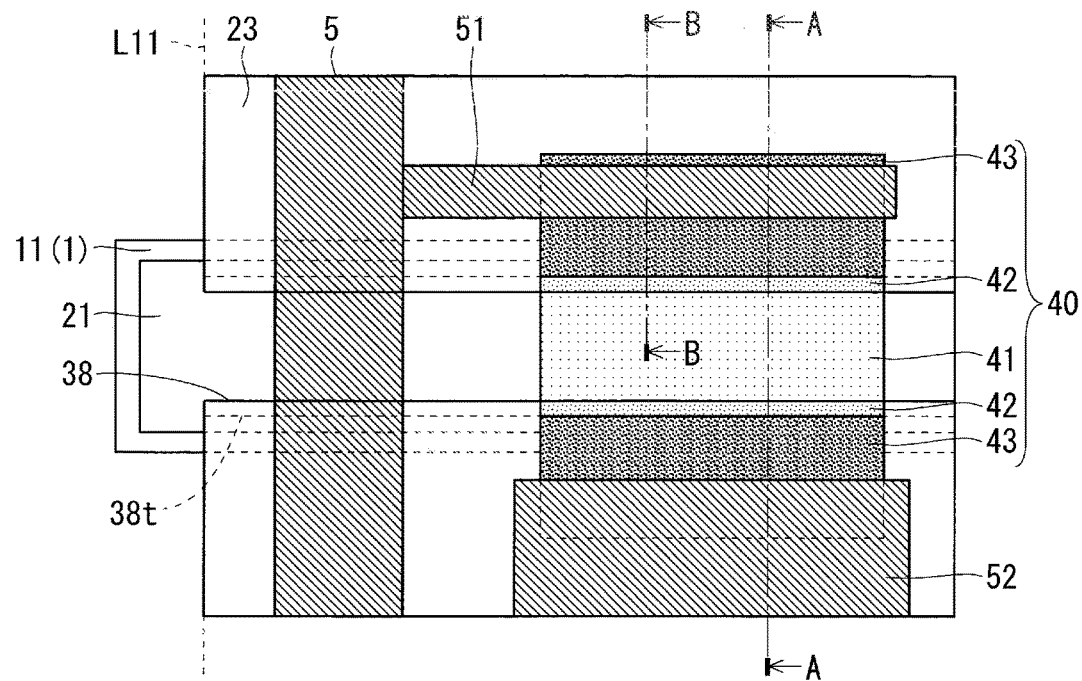
F I G. 6
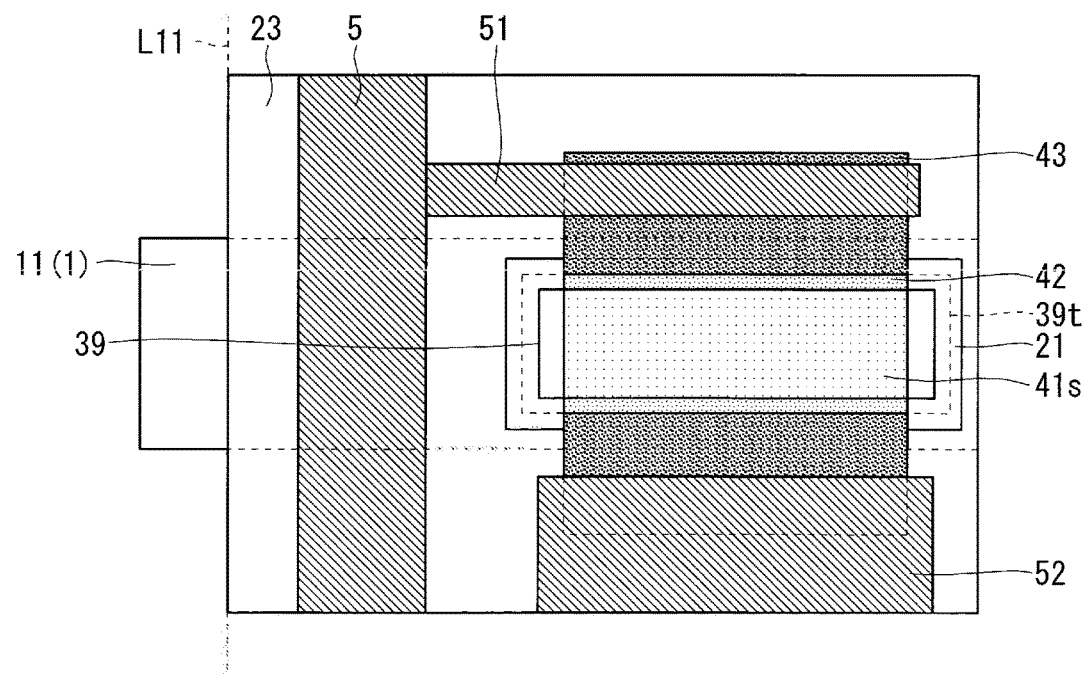

F I G . 2 2
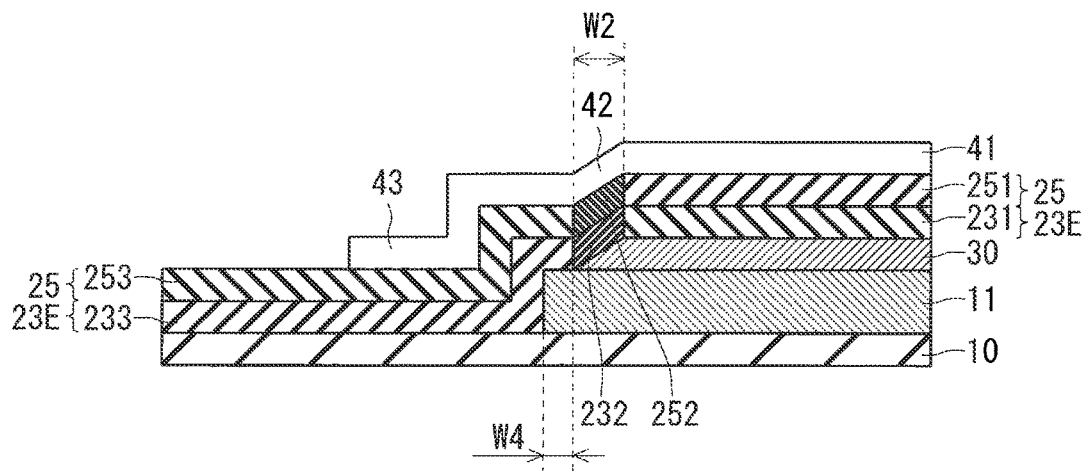
F I G . 2 3
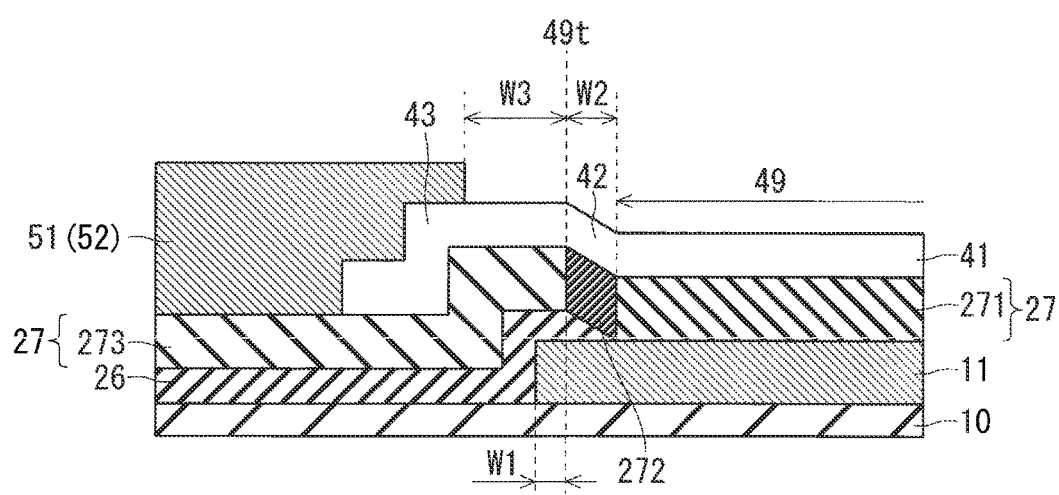

F I G . 3 6
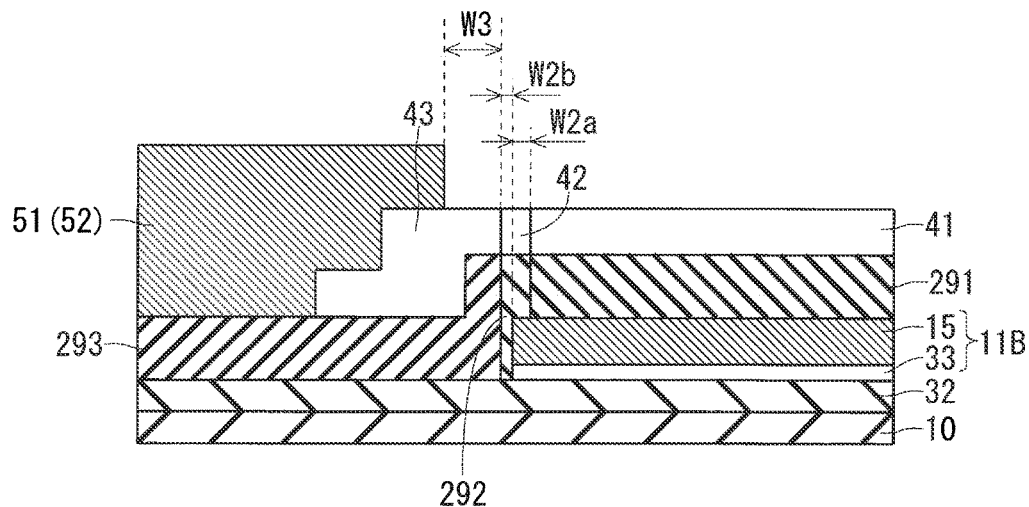
F I G . 3 7
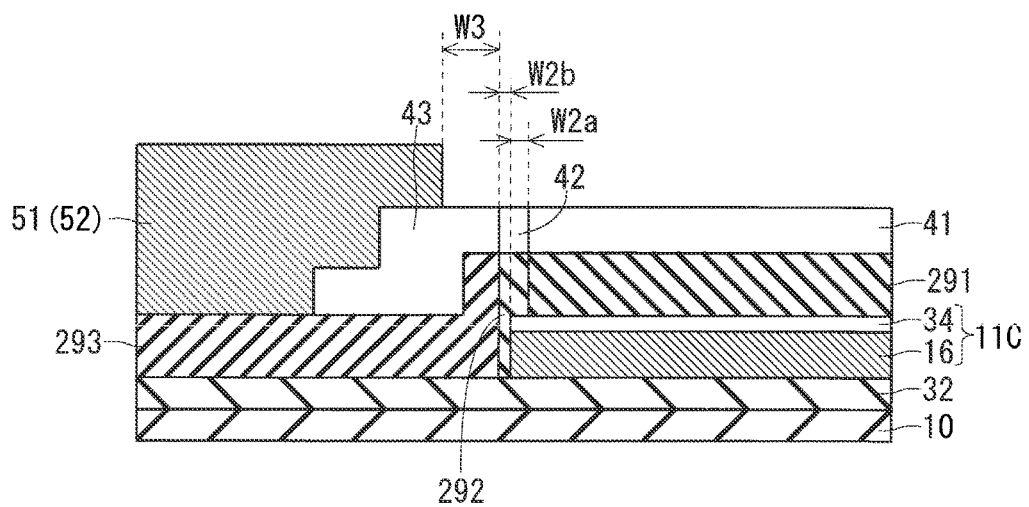

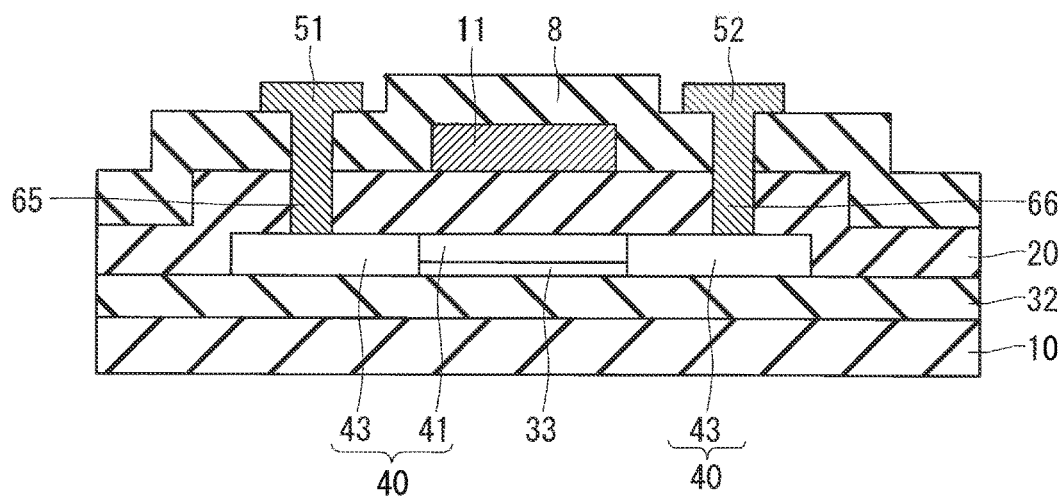
F I G . 4 0

THIN FILM TRANSISTOR AND ARRAY SUBSTRATE

BACKGROUND OF THE INVENTION

Field of the Invention

The present invention relates to a thin film transistor having an oxide semiconductor thin film layer as an active layer, and an array substrate.

Description of the Related Art

A thin film transistor (TFT) has been actively developed in which an oxide semiconductor mainly containing zinc oxide (ZnO) is used for a semiconductor layer serving as an active layer. The oxide semiconductor enables a TFT with higher mobility to be formed as compared with an amorphous silicon semiconductor, and thus provides an advantage such that a high-definition panel can be realized and a drive circuit can be formed in a panel.

For example, Japanese Patent Application Laid-Open No. 2007-220817, Japanese Patent Application Laid-Open No. 2012-33836, and International Publication No. 2012/043338 disclose a thin film transistor using an oxide semiconductor layer as an active layer.

When a thin film transistor (hereinafter, occasionally a "TFT") using an oxide semiconductor layer as an active layer (a channel region, source and drain regions) is used, the thin film transistor has a structure such that source and drain electrodes and the oxide semiconductor layer are directly connected to each other. This is because s difficult to form a region corresponding to a region where impurities are doped into silicon (Si) in order to obtain an ohmic contact layer that is used in a conventional Si-TFT and facilitates contact between source and drain electrodes and Si.

However, a conductive film on the source electrode that partially contacts with the oxide semiconductor layer is oxidized to have high resistance, and thus parasitic resistance is generated. As a result, a desired switching characteristic cannot be obtained in some cases.

In a structure examined as a countermeasure, a top gate type TFT is formed, and resistance of source and drain regions in an oxide semiconductor layer is reduced by hydrogen in an interlayer film and by using a gate electrode and a gate insulating film as masks.

However, in a case of an inverse-stagger structured TFT having a bottom gate that is generally used in an amorphous Si-TFT of an array of a liquid crystal display (hereinafter, occasionally "LCD"), it is difficult to reduce the resistance of the source and drain regions to be formed in the oxide semiconductor layer because the source and drain electrodes are formed between the interlayer film and the oxide semiconductor layer. On the other hand, since a channel region formed between the source and drain electrodes is exposed when the interlayer film is formed, hydrogen is supplied from the interlayer film, the resistance of the channel region is reduced, and thus an off operation is lost.

SUMMARY OF THE INVENTION

It is an object of the present invention to obtain a thin film transistor in which an oxide semiconductor layer is employed as an active layer, instead of amorphous Si, in an LCD array using an amorphous Si-TFT, and a switching characteristic and stability of an off operation are improved, and to obtain an array substrate having the thin film transistor.

The thin film transistor of the present invention includes a gate electrode, a gate insulating film, an oxide semiconductor layer, and a source electrode. The gate electrode is formed on the insulating substrate. The gate insulating film is formed over the insulating substrate and partially on the gate electrode. The oxide semiconductor layer is formed on the gate insulating film. The source electrode is formed on the oxide semiconductor layer.

The gate insulating film includes a first insulating region formed on the gate electrode, and a second insulating region that is formed over the insulating substrate without the gate electrode interposed therebetween, and is different in hydrogen content from the first insulating region. The oxide semiconductor layer includes a first oxide semiconductor region that is formed on the first insulating region and has at least a channel region, and a second oxide semiconductor region that is formed on the second insulating region and is connected to the source electrode. The first oxide semiconductor region is higher in resistance than the second oxide semiconductor region.

In the thin film transistor of the present invention, the first oxide semiconductor region and the second oxide semiconductor region are formed on the first insulating region and the second insulating region that have different hydrogen related characteristics, so that the resistance is set to be higher in the first oxide semiconductor region than the second oxide semiconductor region.

For this reason, the first oxide semiconductor region that forms the channel region of the thin film transistor of the present invention is set to have comparatively higher resistance, so that a first effect such that a satisfactory off characteristic is obtained can be produced. Further, the second oxide semiconductor region is set to have comparatively lower resistance, so that a second effect such that at least contact resistance with respect to the source electrode is stably kept low and a satisfactory switching characteristic is exhibited can be produced.

These and other objects, features, aspects and advantages of the present invention will become more apparent from the following detailed description of the present invention when taken in conjunction with the accompanying drawings.

BRIEF DESCRIPTION OF DRAWINGS

FIG. 3 is an explanatory diagram schematically illustrating an array structure for LCD using the TFT shown in FIG. 1;

FIG. 4 is a plan view schematically illustrating a planar structure in a pixel region;

FIG. 5 is a plan view schematically illustrating a planar structure of the TFT according to the first preferred embodiment;

FIG. 6 is a plan view schematically illustrating the TFT according to a first modified example of the first preferred embodiment;

FIG. 22 is a cross-sectional view illustrating a sectional structure according to the modified example of the third preferred embodiment;

FIG. 23 is a cross-sectional view illustrating a detailed structure of the TFT according to a fourth preferred embodiment of the present invention;

FIG. 36 is a cross-sectional view illustrating a sectional structure according to a modified example of the fifth preferred embodiment;

FIG. 37 is a cross-sectional view illustrating a sectional structure according to the modified example of the fifth preferred embodiment;

FIG. 40 is a cross-sectional view illustrating a sectional structure according to a second modified example of the sixth preferred embodiment.

DESCRIPTION OF THE PREFERRED EMBODIMENTS

Preferred embodiments of the present invention are described below. The following description refers to preferred embodiments of the present invention, and the present invention is not limited to the following preferred embodiments. Further, in order to clarify the description, the description and the drawings described below are suitably omitted and simplified. Further, in order to clarify the description, overlapped description is omitted as need arises.

First Preferred Embodiment

Figure 1:
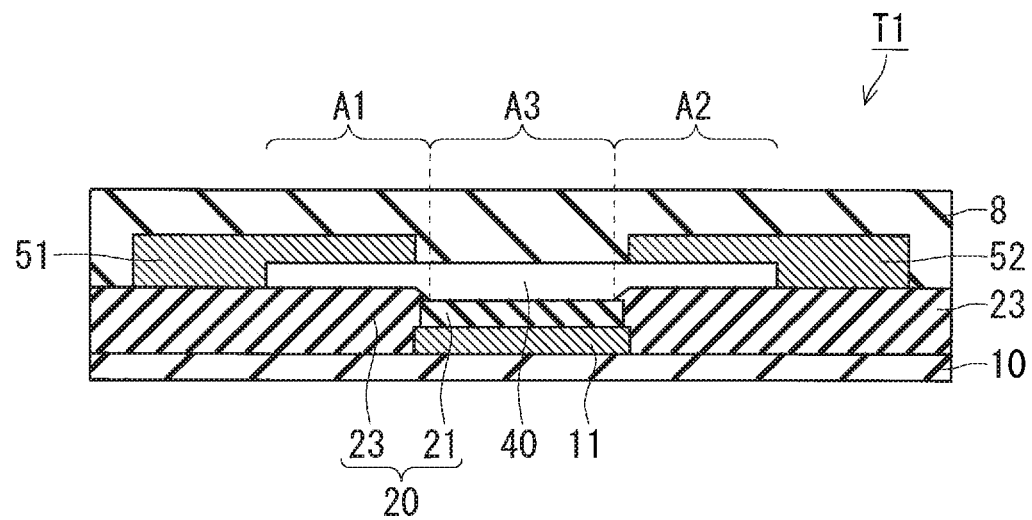
FIG. 1 is a cross-sectional view illustrating an entire structure of a TFT according to a first preferred embodiment of the present invention.
Figure 2:
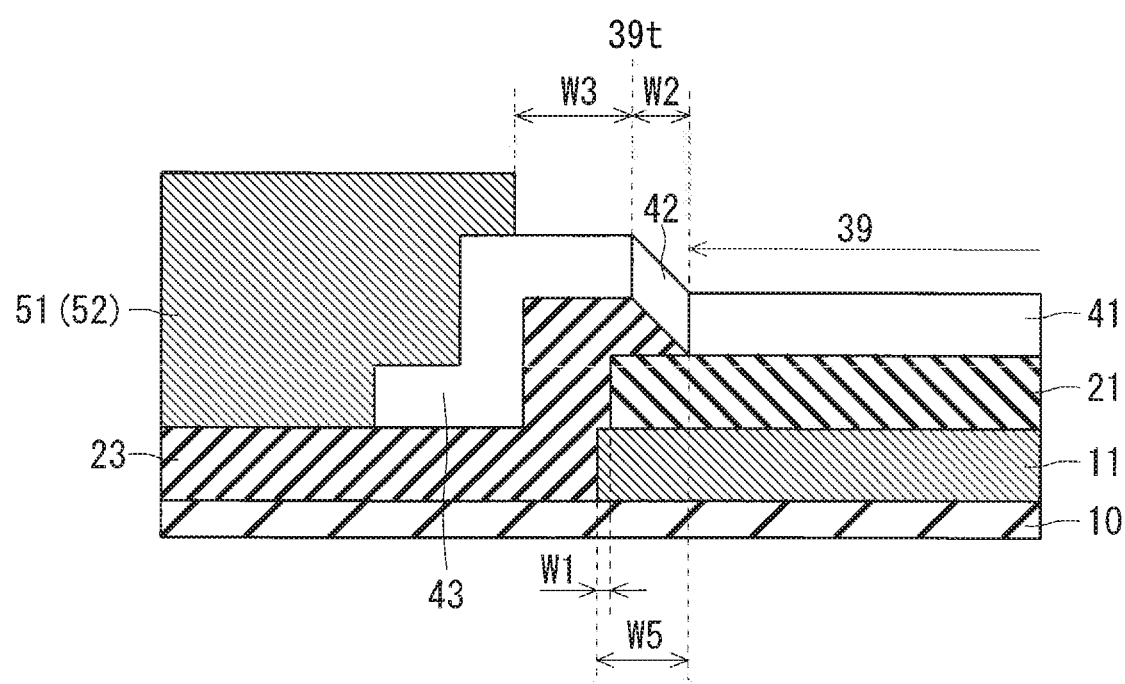
FIG. 2 is a cross-sectional view illustrating a detailed structure of the TFT according to the first preferred embodiment.

FIG. 1 is a cross-sectional view illustrating an entire structure of a TFT according to a first preferred embodiment of the present invention. FIG. 2 is a cross-sectional view illustrating a detailed sectional structure of the TFT according to the first preferred embodiment, and illustrates a detailed structure between a gate electrode and a source electrode (a drain electrode). FIG. 3 is an explanatory diagram schematically illustrating an array structure for LCD using the TFT shown in FIG. 1.

In FIG. 1, an oxide semiconductor layer 40 functions as an active layer of a switching transistor T1 having a source region A1, a drain region A2, and a channel region A3. Further, in the following description, the structure shown in FIG. 1 is occasionally used as a common structure of the TFT of the present invention including the TFT according to the first preferred embodiment.

As shown in FIG. 3, a display region 100 is provided to an insulating substrate 10 serving as an array substrate of a display device that uses the TFT according to the first preferred embodiment as the switching transistor T1. The display region 100 is formed with a plurality of gate wires 1 (scanning signal lines) each of which is formed along a lateral direction in the drawing, a plurality of source wires 5 (display signal lines) each of which is formed along a vertical direction in the drawing, and a plurality of common wires 7 (the drawings illustrate only one).

The plurality of gate wires 1 and the plurality of common wires 7 are provided so as to be parallel with each other. Similarly, the plurality of source wires 5 are provided so as to be parallel with each other. The gate wires 1 and the source wires 5 are formed so as to intersect with each other in the display region 100. A region surrounded by the adjacent gate wires 1 and the adjacent source wires 5 is a pixel (region). Therefore, a plurality of pixels are arranged into a matrix pattern on the display region 100 (see FIG. 3). In FIG. 3, the common wires 7 are disposed in the same direction as the gate wires 1, but may be disposed in the same direction as the source wires 5 depending on a design of an aperture ratio in a pixel shape.

The switching transistor T1 having at least one TFT structure is formed within each pixel region, and the switching transistor T1 is disposed near an intersection of each source wire 5 and each gate wire 1. A gate drive circuit 110 is disposed on extended portions of the gate wires 1 around the display region 100. The gate drive circuit 110 transmits a gate signal for determining an ON or OFF state of the switching transistor T1 serving as a pixel TFT to each of the gate wires 1. A source drive circuit 120 that transmits a signal to be display information of a pixel is disposed on extended portions of the source wires 5.

The gate drive circuit 110 and the source drive circuit 120 are structured by using switching elements which are different in a channel width W/a channel length L of the transistor from each other but the same in a structure as the switching transistor T1 that is a TFT of a pixel portion. Various wires and the common wires 7 for the gate drive circuit 110 and the source drive circuit 120 are electrically connected to an external circuit via a flexible printed circuit (FPC) 130 bonded onto a terminal formed around the array substrate using an anisotropic conductive film (ACF). The description refers to the case where the gate drive circuit 110 and the source drive circuit 120 are formed on the insulating substrate 10 serving as the array substrate, but an IC chip or the like may be mounted onto the array substrate instead of the drive circuits.

For example, in a display device using liquid crystal, a TFT supplies a display voltage to a pixel electrode. That is to say, the switching transistors T1 that are switching elements of pixels are turned on by gate signals from the gate wires 1. Display voltages are applied from the source wires 5 to pixel electrodes 6 connected to drain electrodes 52 of the switching transistors T1 by the ON operation of the switching transistors T1. An electric field in accordance with the display voltage is generated between a counter electrode (not shown) formed on a color filter (CF) opposite to the array substrate and the pixel electrode 6. This electric field drives the liquid crystal, and an orientation direction of the liquid crystal changes between a substrate on a CF side and the array substrate. As a result, quantity of light passing through the array substrate can be changed. That is to say, the display voltage is varied on each pixel, so that a desired image can be displayed.

FIG. 4 is a plan view schematically illustrating a planar structure in a pixel region. FIG. 5 is a plan view schematically illustrating a planar structure of the TFT according to the first preferred embodiment that functions as the switching transistor T1. An A-A cross section in FIG. 5 corresponds to the structure shown in FIG. 1, and a B-B cross section in FIG. 5 corresponds to the structure shown in FIG. 2.

The structure of the switching transistor T1 that is the TFT according to the first preferred embodiment is described below with reference to FIG. 1 to FIG. 5. FIG. 5 illustrates only a gate electrode 11 (the gate wires 1) and a gate insulating film 21 as the structure on the left side of an auxiliary line L11 in the drawing in order to provide easy understanding of TFT characteristics according to the first preferred embodiment.

The gate wires 1 and the common wires 7 made of a first conductive film are formed on the insulating substrate 10 serving as the array substrate as shown in FIG. 3. The gate wires 1 and the common wires 7 are covered with a gate insulating film 20 (21+23) similarly to the gate electrode 11 shown in FIG. 1 and FIG. 2. The gate electrode 11 is formed to be extended from the gate wires 1, for example, so as to be electrically connected with the gate wires 1.

The switching transistor T1 that is the TFT according to the first preferred embodiment includes the gate electrode 11, the gate insulating film 20, the oxide semiconductor layer 40, a source electrode 51 and the drain electrode 52 as shown in FIG. 1 and FIG. 2. The gate electrode 11 is made of the first conductive film. The gate insulating film 20 covers the gate electrode 11. The oxide semiconductor layer 40 is formed on the gate insulating film 20. The source electrode 51 and the drain electrode 52 are formed to be electrically connected to the oxide semiconductor layer 40 and are made of a second conductive film. The source electrode 51 is formed to be electrically connected to the source wires 5 and to be branched from the source wires 5. The source electrode is an electrode that is connected to a wire (a signal line) for supplying a data signal to a thin film transistor, and may be formed separately from the signal line or may be extended from the signal line (in this case, a thin film transistor constitutional portion of the signal line corresponds to the source electrode).

An interlayer insulating film 8 is formed on the switching transistor T1 that is the TFT according to the first preferred embodiment as shown in FIG. 1, and a contact hole 62 (not shown in FIG. 1, see FIG. 4) that reaches a surface of a drain electrode pattern forming region is formed on the interlayer insulating film 8. The pixel electrode 6 is electrically connected to the drain electrode 52 via the contact hole 62 as shown in FIG. 4.

The common wires 7 are branched around the pixel electrode 6 so as to form a common electrode 71 as shown in FIG. 4. A capacity is formed on a region where the common electrode 71 and the pixel electrode 6 are overlapped in a planar view. The capacity uses a common wire insulating film 81 (an insulating film on the same layer as the gate insulating film 20 formed on the gate electrode 11), which is formed on the common electrode 71, and the interlayer insulating film 8 as a dielectric.

The detailed structure of the TFT according to the first preferred embodiment is such that the gate electrode 11 and the gate insulating film 21 (a first gate insulating film) are formed on an inside of a pattern edge of the gate electrode 11 as shown in FIG. 1 and FIG. 2. The gate electrode 11 made of the first conductive film is formed on the insulating substrate 10. The gate insulating film 21 is formed on the gate electrode 11 and is formed of an oxide silicon film containing comparatively small amount of hydrogen and satisfying a condition A, described later. That is to say, the gate insulating film 21 is formed directly only on the gate electrode 11.

A gate insulating film 23 (a second gate insulating film) is formed over the pattern edge of the gate insulating film 21 through an entire surface of the insulating substrate 10 as shown in FIG. 2. The gate insulating film 23 is formed of a silicon nitride film containing a comparatively large amount of hydrogen and satisfying a condition B, described later, for example.

The condition A and the condition B are as follows.

Condition A: hydrogen content is 0.2 (at % (atom %)) or less

Condition B: hydrogen content is within a range of 10 to 35 (at %)

Since a part of the gate insulating film 23 is formed on an end of the gate insulating film 21, an insulating film laminated structure where the gate insulating films 21 and 23 are laminated is present. In the laminated structure of the gate insulating films 21 and 23 according to the first preferred embodiment, the structure is classified into a first insulating region, a second insulating region, and an intermediate insulating region. The first insulating region has comparatively low hydrogen content and satisfies the condition A. The second insulating region has comparatively high hydrogen content and satisfies the condition B. The intermediate insulating region is formed between the first insulating region and the second insulating region.

That is to say, in the first preferred embodiment, the insulating laminated region in a forming region of the gate insulating film 23 is defined as the intermediate insulating region (a region within a distance W2 in FIG. 2), and the first insulating region is a forming region of the gate insulating film 21 excluding the insulating laminated region. The second insulating region is a region that includes a forming region of the gate insulating film 23 excluding the insulating laminated region.

The gate insulating film 23 is removed from and is not formed on a lower region of an oxide semiconductor region 41 serving as a channel region of the TFT according to the first preferred embodiment, and the gate insulating film 21 is exposed through an opening 38 as shown in FIG. 5.

The oxide semiconductor layer 40 is formed over the gate insulating film 21 through a part of the gate insulating film 23 as shown in FIG. 1, FIG. 2, and FIG. 5.

The oxide semiconductor layer 40 is classified into three regions including the oxide semiconductor regions 41 to 43 as shown in FIG. 2 and FIG. 5.

The oxide semiconductor region 41 (a first oxide semiconductor region) is a region to be formed on the first insulating region of the gate insulating film 21. An oxide semiconductor region 42 (an intermediate oxide semiconductor region) is formed on the intermediate insulating region of the gate insulating film 23, namely, a tapered region where a sectional shape of a front end of the gate insulating film 23 is tapered (a region within a distance W2 in FIG. 2). An oxide semiconductor region 43 (a second oxide semiconductor region) is a region to be formed on the second insulating region of the gate insulating film 23. In such a manner, the intermediate oxide semiconductor region is disposed so as to be sandwiched between the first oxide semiconductor region and the second oxide semiconductor region, so that an LDD structure is formed.

As a result, the oxide semiconductor region 41 to be formed on the first insulating region as a region from which the gate insulating film 21 is exposed has comparatively high resistance, and satisfies a condition C1, described later, for example. The oxide semiconductor region 43 to be formed on the second insulating region of the gate insulating film 23 has comparatively low resistance, and satisfies a condition C3, described later, for example.

The oxide semiconductor layer 40 on the tapered region (the intermediate insulating region) to be a slope of an opening 39 (an opening upper end portion 39$t$) in a case of a slope shape serves as the oxide semiconductor region 42 due to the tapered region of the end of the gate insulating film 23. For this reason, the oxide semiconductor region 42 has resistance that is intermediate between the oxide semiconductor region 41 and the oxide semiconductor region 43 so that a condition C2, for example, is satisfied.

The conditions C1 to C3 are as follows.

The condition C1: sheet resistance is 50 M ($\Omega$/sq) or more (desirably, 1 G ($\Omega$/sq) or more).

The condition C2: the sheet resistance is within a range of 1 K to 100 M ($\Omega$/sq).

The condition C3: the sheet resistance is within a range of 1 to 50 K ($\Omega$/sq).

A partially overlapped range is present among the conditions C1 to C3, but the sheet resistances R1 to R3 on the oxide semiconductor regions 41 to 43 always satisfy a relationship such that R1>R2>R3.

A reason why the oxide semiconductor regions 41 to 43 have the above sheet resistances R1 to R3, respectively, is described below.

Since the gate insulating film 23 has the comparatively high hydrogen content that satisfies the condition B, the hydrogen of the gate insulating film 23 moves to the oxide semiconductor layer 40, so that the resistances of the oxide semiconductor regions 42 and 43 of the oxide semiconductor layer 40 reduce.

On the other hand, since the gate insulating film 21 has the comparatively low hydrogen content that satisfies the condition A, the hydrogen of the gate insulating film 21 hardly moves to the oxide semiconductor layer 40, so that the high resistance of the oxide semiconductor region 41 of the oxide semiconductor layer 40 is maintained.

Further, since the intermediate insulating region of the gate insulating film 23 is the tapered region, mobility of the hydrogen from the gate insulating film 23 to the oxide semiconductor layer 40 is lower than the second insulating region of the gate insulating film 23 due to thinning of a film thickness. For this reason, a sheet resistance R2 of the oxide semiconductor region 42 is higher than a sheet resistance R3 of the oxide semiconductor region 43. That is to say, the intermediate insulating region on the gate insulating film 23 is made to be smaller in the film thickness than the other regions, so that the mobility of the hydrogen to the oxide semiconductor layer 40 (the oxide semiconductor region 42) on an upper side can be reduced.

As a result, the sheet resistances R1 to R3 of the oxide semiconductor regions 41 to 43 satisfy the conditions C1 to C3 and establish the relationship such that "R1>R2>R3". The basic structure shown in FIG. 1 to FIG. 6 according to the first preferred embodiment has a hydrogen related characteristic such that the hydrogen content of the first insulating region is lower than the hydrogen content of the second insulating region.

The oxide semiconductor regions 41 to 43 are formed on the first insulating region of the gate insulating film 21, the intermediate insulating region of the gate insulating film 23, and the second insulating region of the gate insulating film 23, respectively. As a result, the sheet resistances R1 to R3 of the oxide semiconductor regions 41 to 43 are set so that R1>R2>R3.

Electric connections between the source electrode 51 and the oxide semiconductor layer 40 and between the drain electrode 52 and the oxide semiconductor layer 40 are realized by contact with the oxide semiconductor region 43. As shown in FIG. 2, the source electrode 51 and the drain electrode 52 are disposed so as to be separated from the oxide semiconductor region 41 by a distance (W2+W3), respectively.

With such a structure, the oxide semiconductor region 41 to be the channel region of the TFT according to the first preferred embodiment is always formed inside the end of the gate electrode 11 by a distance W5 as shown in FIG. 2. For this reason, light to be incident from a rear surface of the insulating substrate 10 is blocked by the gate electrode 11, so that the channel region can be protected against the incident light, and thus an operation property of the TFT can be prevented from being deteriorated.

Further, since the oxide semiconductor region 41 having the comparatively high resistance does not contact with the source electrode 51 and the drain electrode 52 formed by the second conductive film, an electric change in a channel length caused by formation of a region without ohmic contact on the end of the channel region and a change in the channel length caused by a reaction of the second conductive film for the source electrode 51 (the drain electrode 52) with the oxide semiconductor layer 40 can be restrained. As a result, a temporal change is restrained and a stable switching operation is secured in the TFT according to the first preferred embodiment so that a life of the TFT can be lengthened.

Further, the gate insulating film 21 is formed inside a pattern of the gate electrode 11 in a planar view, so that coatability of the gate insulating film 23 at a gate electrode edge can be improved. At this time, a distance W1 between the end of the gate electrode 11 and the end of the gate insulating film 21 is desirably longer (or wider) than a film thickness of the gate insulating film 21.

The oxide semiconductor region 42 is formed between the oxide semiconductor regions 41 and 43 so that concentration of an electric field on a boundary between the channel region and each of source and drain regions of the TFT can be relieved, and deterioration in the TFT characteristics can be restrained. For this reason, it is desirable that a slope shape is applied to the opening 39 of the gate insulating film 23 like the first preferred embodiment.

Further, as to a TFT size on a peripheral drive circuit forming region, a width of the gate electrode is limited by a minimum dimension of the channel length in an exposing device and overlapping accuracy of the gate electrode 11 and the source electrode 51 or the drain electrode 52. For this reason, an occupation area of the TFT is large in a conventional drive circuit. In this constitution, the channel region is formed by the gate electrode using self-alignment exposure on the rear surface, so that an influence of the overlapping accuracy can be eliminated. As a result, the gate electrode can be designed into a narrow width, and thus narrow frame design is enabled.

Figure 9:
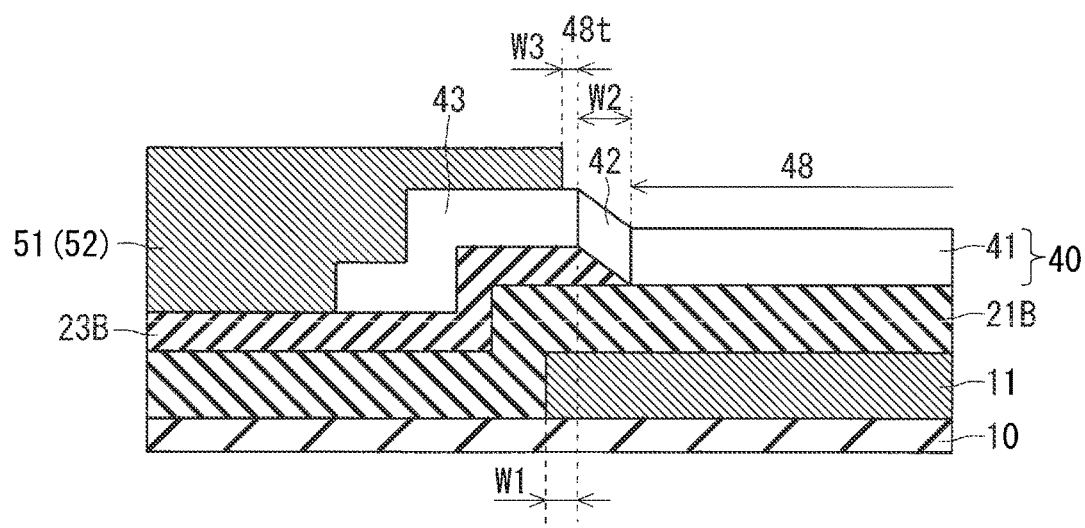
FIG. 9 is a cross-sectional view illustrating a sectional structure according to the second modified example of the first preferred embodiment.

FIG. 2 illustrates the case where the ends of the source electrode 51 and the drain electrode 52 are disposed outside the end of the gate electrode, but the ends of the source electrode 51 and the drain electrode 52 may be partially present on the gate electrode 11 as long as the ends of the source electrode 51 and the drain electrode 52 are separated from the channel region as shown in FIG. 9, described later. FIG. 9 illustrates a structure of a second modified example, described later, and the above description only refers to FIG. 9 as a concrete example relating to relevance between the gate electrode 11, the source electrode 51 and the drain electrode 52.

A TFT manufacturing method according to the first preferred embodiment is described below.

For example, a film of an Al alloy having a thickness of 200 nm is formed as the first conductive film on the insulating substrate 10, and then, for example, $SiO_2$ film having a thickness of 300 nm is formed by using a CVD method. Thereafter, the film is subjected to an annealing process at a temperature of 400° C. to desorb hydrogen in the film.

A resist pattern for forming a gate wire/electrode and a common wire/electrode is formed by photoengraving. An $SiO_2$ film is dry-etched by using $CF_4$ (carbon tetrafluoride)+ Ar (argon) gas based on the formed resist pattern so that a pattern of the gate insulating film 21 is formed.

Thereafter, Al alloy is dry-etched by using $BCl_3$ (boron trichloride)+$Cl_2$ (chlorine) gas and the etching is progressed while a deposit is being formed on a sidewall (while a pattern having a trapezoidal sectional shape is being formed by forming on a sidewall an organism reactive with an etching gas during etching). As a result, a laminated pattern in which a pattern width of Al (the gate electrode 11) is wider than a pattern width of $SiO_2$ (the gate insulating film 21) can be formed.

The resist is removed after the dry etching. The annealing process is performed at a temperature of 400° C. just after the film formation, as a method for desorbing hydrogen in the $SiO_2$ film in order to repress hillock from the first conductive film. However, when a gate wire material that does not generate hillock or the like is selected, the annealing process may be performed after the patterning. Further, a temperature of the annealing process after the film formation of the gate insulating film 21 may be 350° C. or higher and may be higher than a temperature of the annealing process to be performed after film formation of the oxide semiconductor layer 40, described later. Further, the above description has described the method using the dry etching in order to establish a relationship that the gate insulating film 21 is included in the gate electrode 11 in a planar view, but another method may be used.

An SiN film having a thickness of 400 nm is formed by using a CVD method, for example. Thereafter, when a negative resist is applied and then a rear surface is exposed and developed, a resist pattern like a resist 35 shown in FIG. 10, described later, can be obtained. The resist 35 has an opening having a shape similar to the shapes of the gate wires 1 and the gate electrode 11.

The condition of the photoengraving is set so that the end of the resist pattern covers the ends of the gate wires 1 and the gate electrode 11. Dry etching is performed by using $SF_6$ (sulfur hexafluoride) or $CF_4$+$O_2$ (oxygen) gas and using the resist pattern obtained by the photoengraving. As a result, a selection ratio with respect to the gate insulating film 21 is secured and simultaneously etching on the SiN film is enabled, so that the gate insulating film 23 can be formed. At this time, when oxygenated gas is used, the resist is retreated like the resist 35 shown in FIG. 11, described later, so that the tapered region whose sectional shape is tapered can be formed on the end of the gate insulating film 23 on the gate electrode 11. After the dry etching, the resist is removed.

Figure 10:
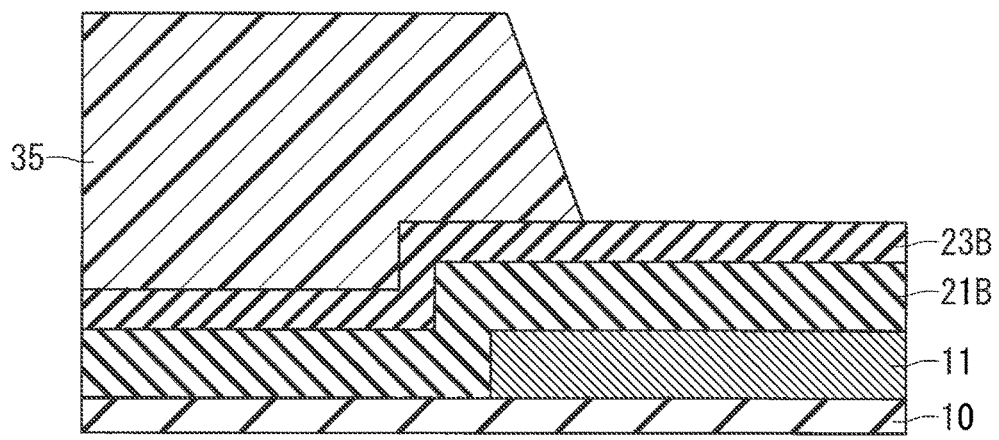
FIG. 10 is a cross-sectional view illustrating a part of a manufacturing method according to the second modified example of the first preferred embodiment.
Figure 11:
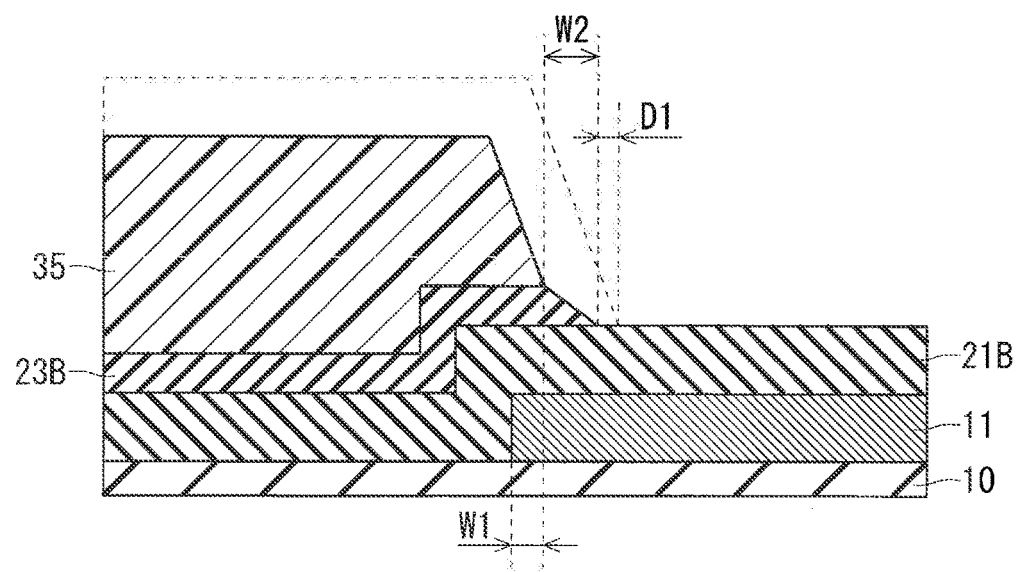
FIG. 11 is a cross-sectional view illustrating a part of the manufacturing method according to the second modified example of the first preferred embodiment.

FIG. 10 and FIG. 11 are diagrams illustrating a second modified example of the first preferred embodiment, described later. FIG. 10 and FIG. 11 are used only for easy understanding of the resist pattern shape.

For example, an InGaZnO-based oxide semiconductor layer 40 having a thickness of 50 nm is formed by using a sputtering method, and wet etching is performed by using, for example, an oxalic etching liquid after resist patterning, and then the resist is removed.

Thereafter, when the annealing process is performed at a temperature of for example, 350° C., an electrical damage in the oxide semiconductor layer 40 is reduced, the hydrogen included in the SiN film moves to the oxide semiconductor layer 40 on a region that contacts with the gate insulating film 23, and reduction is caused in the oxide semiconductor layer 40. As a result, the oxide semiconductor region 43 whose resistance is reduced is obtained. On the other hand, since the hydrogen is hardly supplied from the $SiO_2$ film to the oxide semiconductor region 41 that is the region contacting with the gate insulating film 21, the high resistance of the oxide semiconductor region 41 is maintained.

A laminated film whose lower layer is formed of Mo alloy having a thickness of 50 nm and whose upper layer is formed of Al alloy having a thickness of 200 nm is formed as the second conductive film, and resist patterning is performed. Thereafter, wet etching is performed by using, for example, a phosphate/nitrate/acetic etching liquid so that the source electrode 51 and the drain electrode 52 are formed. Thereafter, the resist is removed. For example, the annealing process is performed at a temperature of 300° C. on the exposed portion of the oxide semiconductor layer 40 caused by the etching after the patterning of the second conductive film in order to repair the electrical damage.

An $SiO_2$ film having a thickness of 300 nm is formed by using, for example, a CVD method in order to form the interlayer insulating film 8. Thereafter, a resist pattern to be the contact hole 62 is formed on the drain electrode 52, and dry etching is performed by using $CF_4$+Ar-based gas, so that the drain electrode 52 as a region of the contact hole 62 is exposed. Thereafter, the resist is removed. At this time, a terminal portion to be connected to an FPC 130 and an opening for connection between the first conductive film and the second conductive film on the gate drive circuit 110 and the source drive circuit 120 are simultaneously formed.

An amorphous indium tin oxide (ITO) is formed by using the sputtering method, a resist pattern for the pixel electrode 6 is formed, and wet etching is performed by using an oxalic etching liquid, so that the pixel electrode 6 is obtained. Thereafter, the resist is removed. At this time, patterns for connection between the first conductive film and the second conductive film in the drive circuits (the gate drive circuit 110 and the source drive circuit 120) are formed simultaneously.

In the above manner, an array substrate for a TN liquid crystal display having the TFT (the switching transistor T1) according to the first preferred embodiment can be manufactured.

In the TFT manufacturing method according to the first preferred embodiment, the resistance of the oxide semiconductor layer 40 is not reduced by supply of the hydrogen from the interlayer insulating film 8, but the resistance is reduced in the oxide semiconductor region 43 of the oxide semiconductor layer 40 by supply of the hydrogen from the gate insulating film 23. For this reason, the oxide semiconductor region 43 serving as source and drain regions can be formed with the resistance being stably reduced without restraint of a reduction in a resistance of an ohmic contact portion caused by restraint of the movement of the hydrogen due to presence of the source electrode and the drain electrode.

FIG. 6 is a plan view schematically illustrating the TFT according to a first modified example of the first preferred embodiment.

In the basic structure according to the first preferred embodiment shown in FIG. 4 and FIG. 5, the gate insulating film 21 is formed over an entire region on the gate wires 1, the gate electrode 11, the common wires 7, and the common electrode 71 inside respective pattern widths. However, as shown in FIG. 6, the gate insulating film 21 is formed only on a TFT forming portion (a region where the oxide semiconductor layer 40 is formed) and its partial periphery, and the opening 39 (the opening upper end portion 39t) is formed inside the gate insulating film 21, so that an oxide semiconductor region 41s on the gate insulating film 21 of the TFT may be the channel region.

One example of a method for forming a pattern of the gate insulating film 21 according to the first modified example shown in FIG. 6 is described. After the gate wires 1, the gate electrode 11, and the gate insulating film 21 (the basic structure) are patterned, a resist pattern whose pattern shape extends to a direction perpendicular to the gate electrode (a vertical direction in FIG. 6) is further formed. The gate insulating film 21 (the basic structure) is dry-etched so that the gate insulating film 21 can be formed into an island shape. The resist pattern for forming the gate wires 1 is formed by using multi-tone exposure such as rear surface exposure+half exposure from a front surface, so that the resist pattern with uneven film thickness is formed. As a result, the number of steps in the photoengraving process can be reduced.

One example of a method for forming the opening 39 of the gate insulating film 23 shown in FIG. 6 is described below. After a rear surface is exposed via the gate wires 1 and the gate electrode 11 as masks by using negative resist, a pattern in a direction perpendicular to the gate electrode 11 is exposed from a front surface and is developed. As a result, a resist pattern to be the opening 39 is formed in a region which is not irradiated with light during two-time exposure. Thereafter, the dry etching and resist removal are performed so that the opening 39 can be formed on the gate insulating film 23.

(Effects etc.)

In the TFT according to the first preferred embodiment, the oxide semiconductor regions 41 and 43 which are respectively the first oxide semiconductor region and the second oxide semiconductor region are respectively formed on the first insulating region of the gate insulating film 21 and the second insulating region of the gate insulating film 23 whose hydrogen contents as the hydrogen related characteristics are different. As a result, a relationship such that R1>R3 is established. In this relationship, the sheet resistance R1 of the oxide semiconductor region 41 is comparatively high, and the sheet resistance R3 of the oxide semiconductor region 43 is comparatively low.

For this reason, when the oxide semiconductor region 41 for forming the channel region of the TFT according to the first preferred embodiment is set to the sheet resistance R1 that is comparatively high, a first effect such that a satisfactory off characteristic is obtained can be obtained. Further, when the oxide semiconductor region 43 is set to the sheet resistance R3 that is comparatively low, a second effect such that a contact resistance between the source electrode and the drain electrode is stably maintained low and a satisfactory switching characteristic is exhibited can be obtained.

In the first preferred embodiment, the first insulating region is a forming region of the gate insulating film 21 (the first gate insulating film) excluding the insulating laminated layer region (the intermediate insulating region), and the second insulating region is a forming region of the gate insulating film 23 (the second gate insulating film) excluding the insulating laminated region. The gate insulating film 20 (see FIG. 1) is formed into a laminated structure where the gate insulating film 21 and the gate insulating film 23 are laminated, so that a structure that produces the first and second effects is realized.

At this time, the hydrogen contents of the first insulating region and the second insulating region satisfy the condition A and the condition B. That is, the hydrogen content of the first insulating region satisfies the condition A, and the hydrogen content of the second insulating region satisfies the condition B. The sheet resistances of the oxide semiconductor regions 41 and 43 satisfy the condition C1 and the condition C3. That is, the sheet resistance of the oxide semiconductor region 41 satisfies the condition C1, and the sheet resistance of the oxide semiconductor region 43 satisfies the condition C3.

Further, in the TFT according to the first preferred embodiment, the oxide semiconductor region 42 that satisfies the condition C2 is provided between the oxide semiconductor regions 41 and 43, so that concentration of the electric field can be relieved on the boundary between the channel region and the source region and between the channel region and the drain region. The oxide semiconductor region 43 under the source electrode 51 and the drain electrode 52 serves as the source region and the drain region. As a result, a third effect such that deterioration in the TFT operating characteristic is restrained is produced.

Figure 7:
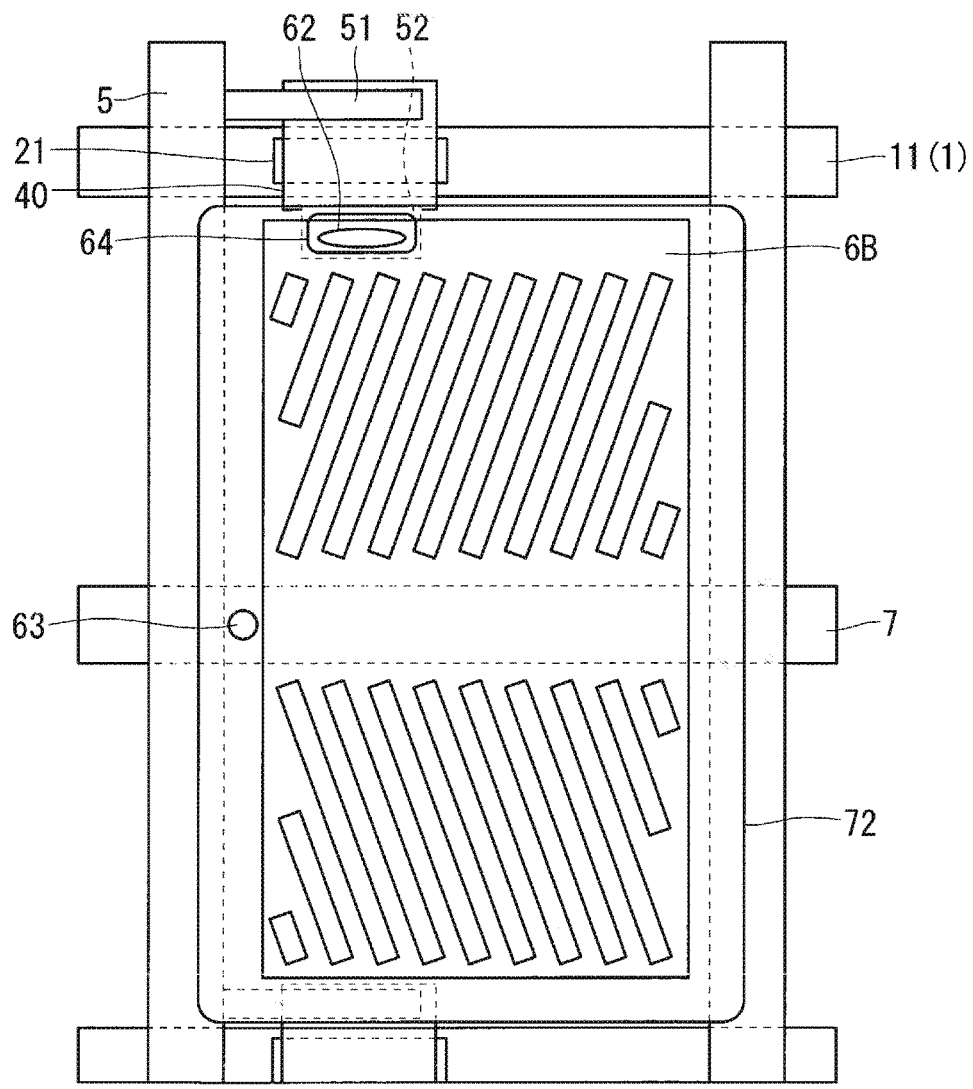
FIG. 7 is a plan view schematically illustrating a planar structure in the pixel region when liquid crystal of an IPS/FFS mode is used as the TFT according to the first preferred embodiment.

FIG. 7 is a plan view schematically illustrating a planar structure in the pixel region when liquid crystal of an IPS/FFS mode is used.

This preferred embodiment describes the structure of the display device using the TN mode liquid crystal, but the TFT may be used for an IPS/IFS mode for driving the liquid crystal in a horizontal electric field as shown in FIG. 7, and the TFT may be used for a pixel switching element of a light emission display device.

Heights of the respective electrodes (the wires) shown in FIG. 7 are set in descending order of the pixel electrode 6B, a common electrode 72, the source electrode 51, the drain electrode 52, the gate electrode 11 (the gate wires 1), and the common wires 7.

The planar structure shown in FIG. 7 is greatly different from the basic structure according to the first preferred embodiment shown in FIG. 4 in that the pixel electrode 6 is replaced by a pixel electrode 6B having a slit and the common electrode 71 is replaced by the common electrode 72 formed so as to be overlapped with the pixel electrode 6B in a planar view. The contact hole 62 is provided for the electric connection between the pixel electrode 6B and the drain electrode 52, and an opening region 64 wider than the contact hole 62 is provided to the common electrode 72 in order to enable the contact hole 62 to be formed. Further, a contact hole 63 is provided for electric connection between the common wires 7 and the common electrode 72.

In such a manner, the TFT according to the first preferred embodiment can be used also as the switching transistor T1 on the pixel region when the IPS/FFS mode liquid crystal is used.

As the basic structure according to the first preferred embodiment, the description has been given of the case where the oxide silicon film that satisfies the condition A is used as the gate insulating film 21 having the comparatively low hydrogen content. However, the gate insulating film 21 may be formed of an insulating film, such as an Al oxide film, an Al nitride film, a Ta oxide film, a Ti oxide film, a Zr oxide film, and an SrTiO$_3$ film, for preventing permeation of hydrogen.

In the above case, the silicon nitride film that satisfies the condition B is used as the gate insulating film 23 whose hydrogen content is comparatively high, but when the silicon nitride film is formed at a low temperature (250° C. or less) as a film formation condition, the hydrogen content can be further increased. Further, instead of the silicon nitride film, a film may be selected from an insulating film having C—H bonding, an insulating film having O—H bonding, and an insulating film containing H$_2$O.

Second Modified Example of First Preferred Embodiment

Figure 8:
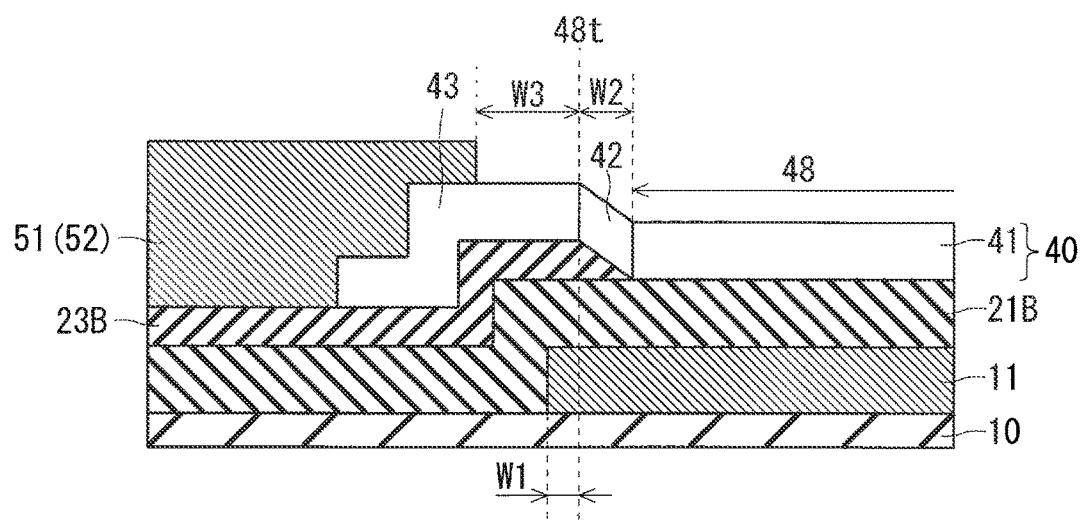
FIG. 8 is a cross-sectional view illustrating a sectional structure according to a second modified example of the first preferred embodiment.
Figure 12:
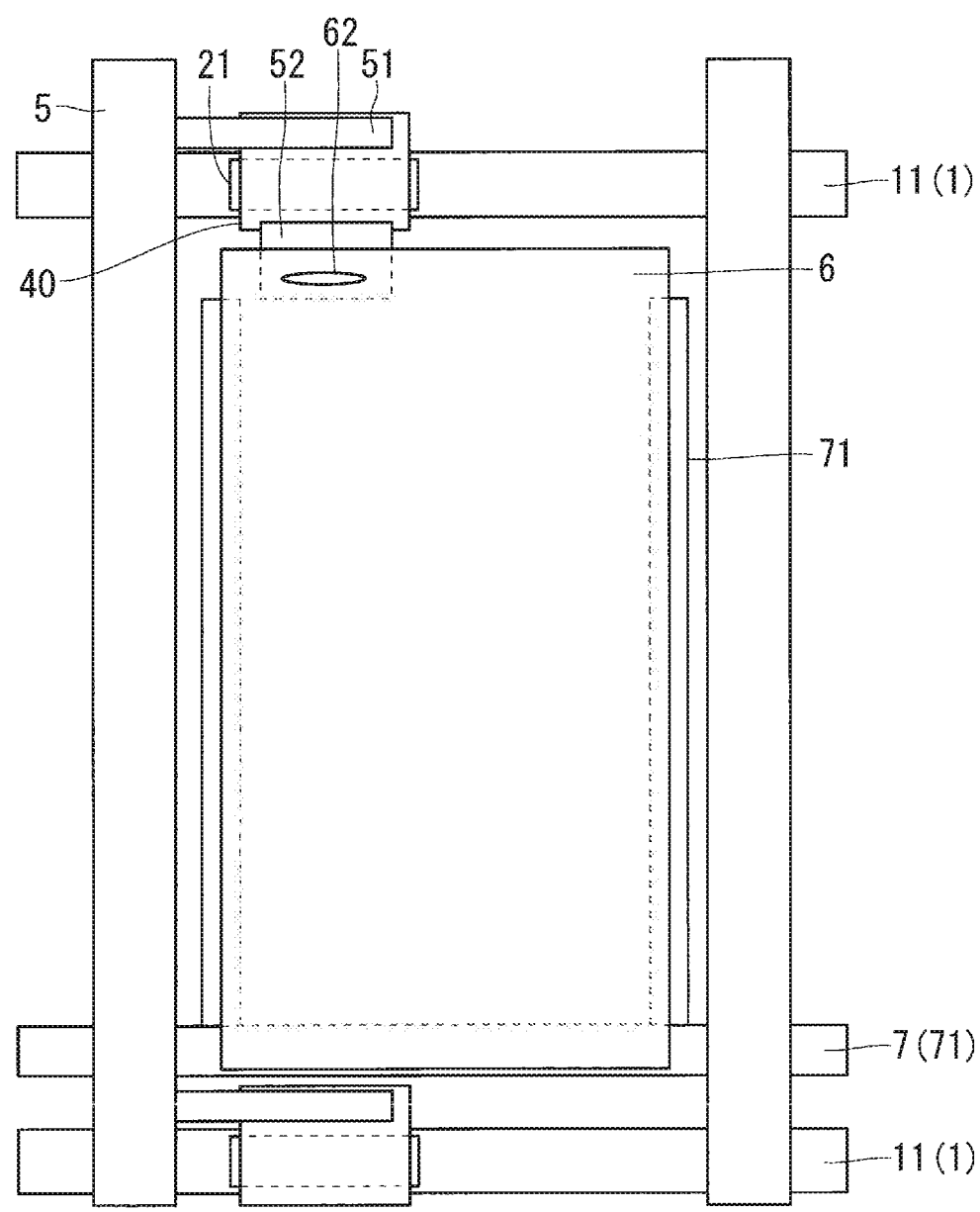
FIG. 12 is a plan view schematically illustrating a planar structure in the pixel region according to the second modified example of the first preferred embodiment.
Figure 13:
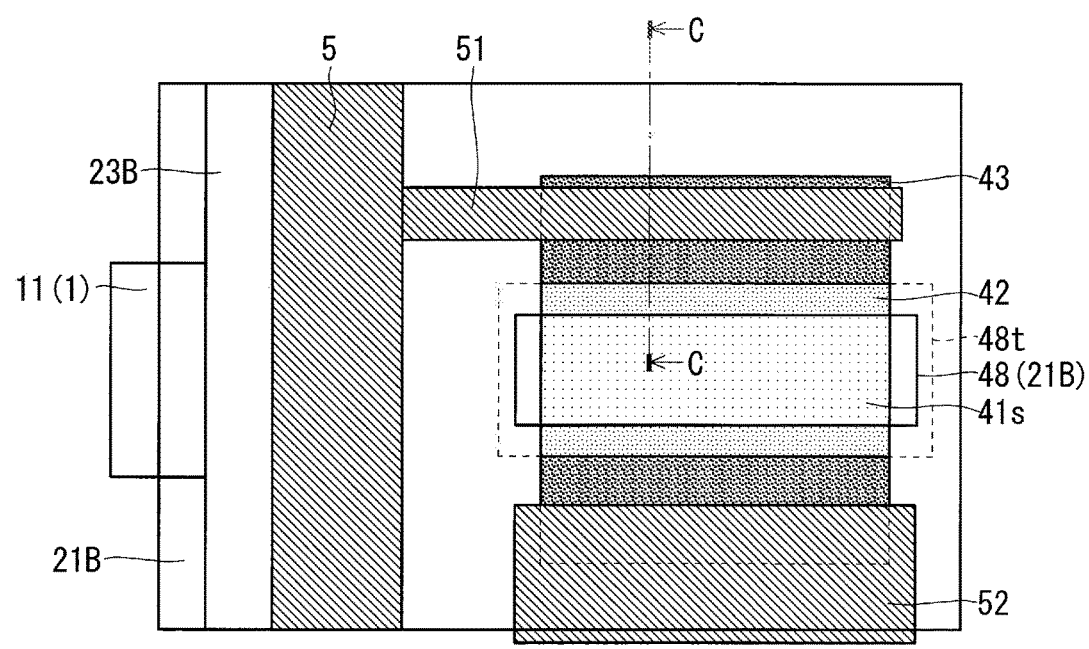
FIG. 13 is a plan view schematically illustrating a planar structure of the TFT according to the second modified example of the first preferred embodiment.

FIG. 8 and FIG. 9 are cross-sectional views illustrating a sectional structure according to a second modified example of the first preferred embodiment. FIG. 10 and FIG. 11 are cross-sectional views illustrating a part of the manufacturing method according to the second modified example of the first preferred embodiment. FIG. 12 is a plan view schematically illustrating a planar structure on a pixel region in the second modified example. FIG. 13 is a plan view schematically illustrating a planar structure according to the second modified example of the first preferred embodiment. A C-C cross section in FIG. 13 corresponds to the structure shown in FIG. 8 and FIG. 9.

The second modified example of the first preferred embodiment is described below with reference to FIG. 8 to FIG. 13.

As shown in FIG. 8 and FIG. 9, a gate insulating film 21B (a first gate insulating film) is formed on an entire surface of an insulating substrate 10 and partially on a gate electrode 11 so as to cover the gate electrode 11. The gate insulating film 21B is formed of, for example, an oxide silicon film having a thickness of 300 nm and comparatively low hydrogen content and satisfying the condition A.

A gate insulating film 23B (a second gate insulating film) is formed on the gate insulating film 21B. The gate insulating film 23B is formed so as to extend over the insulating substrate 10 through an end of the gate electrode 11 via the gate insulating film 21B. The gate insulating film 23B is formed of a silicon nitride film having a thickness of 400 nm and comparatively high hydrogen content and satisfying the condition B. The gate insulating film 21B is exposed from the gate insulating film 23B through an opening 48 formed inside the pattern of the gate electrode 11 (the gate wires 1) as shown in FIG. 8, FIG. 9, and FIG. 13. The gate insulating film 23B (a region indicated by a distance W2) is formed over an outer periphery of the opening 48 in FIG. 13 to an opening upper end portion 48t as shown in FIG. 8 and FIG. 9.

An end of the gate insulating film 23B above the gate electrode 11 has a tapered region whose sectional shape is tapered, and the tapered region of the gate insulating film 23B (a region indicated by the distance W2 in FIG. 8) is defined as the intermediate insulating region.

A forming region of the gate insulating film 21B excluding an insulating laminated region where the gate insulating films 21B and 23B are laminated is the first insulating region. A region of a forming region of the gate insulating film 23B formed on the gate insulating film 21B formed directly on the insulating substrate 10 is the second insulating region. The second modified example of the first preferred embodiment has the hydrogen related characteristic such that the first insulating region is lower in the hydrogen content than the second insulating region similarly to the basic structure according to the first preferred embodiment.

The oxide semiconductor layer 40 having the oxide semiconductor regions 41, 42 and 43 is formed on the first insulating region, the intermediate insulating region, and the second insulating region.

In this manner, in the second modified example of the first preferred embodiment, a double-layered insulating laminated region having the gate insulating film 21B and the gate insulating film 23B is formed on an edge portion of the gate electrode 11 and its periphery. As a result, short, which is caused by a film damage and foreign matters, between different layers of the first conductive film for the gate electrode 11 and the second conductive film for a source electrode 51 (source wires 5) can restrained, yield is improved, and a breakdown withstand voltage can be improved. For this reason, a display device that has resistance electrostatic discharge (ESD) can be realized. Further, since patterning steps of the gate insulating film 21 can be reduced, a manufacturing cost can be reduced.

A difference between the structures shown in FIG. 8 and FIG. 9 is that the source electrode 51 and the drain electrode 52 are partially present above the gate electrode 11 in the structure shown in FIG. 9, and a distance W3 from the opening upper end portion 48t is shorter. Even in the structure in FIG. 9, since the end of the source electrode 51 (the drain electrode 52) is separated from the oxide semiconductor region 41 serving as a channel region by a distance (W2+W3), the operation of the TFT is not inhibited.

A manufacturing method according to the second modified example of the first preferred embodiment is described below with reference to FIG. 10 and FIG. 11.

After the gate electrode 11 is formed on the insulating substrate 10, the gate insulating film 21B and the gate insulating film 23B are laminated on an entire surface of the insulating substrate 10 and partially on the gate electrode 11 in this order. A material and a manufacturing method of the gate insulating films 21B and 23B are substantially similar to the material and the manufacturing method of the gate insulating films 21 and 23 in the basic structure according to the first preferred embodiment.

After the resist 35 as a negative resist is applied, the rear surface is exposed and developed, so that the resist 35 having a resist pattern with an opening whose shape is similar to the shapes of the gate wires 1 and the gate electrode 11 is obtained as shown in FIG. 10. When the opening is formed in a direction perpendicular to the gate wires, the front surface of the substrate is additionally exposed by using a stripe-shaped mask crossing the gate wires.

Thereafter, dry etching is performed by the resist 35 as a mask and using $SF_6$ (or $CF_4+O_2$)-based gas, and the gate insulating film 23B is etched with a selection ratio with respect to the gate insulating film 21B being secured, so that the gate insulating film 23B can be patterned. At this time, as shown in FIG. 11, the resist 35 is retreated by a retreating amount D1 by using oxygenated gas, so that the tapered region whose sectional shape is tapered can be formed on an end of the gate electrode 11 of the gate insulating film 23B.

As described above, the tapered region of the gate insulating film 23B is the intermediate insulating region, and the region of the oxide semiconductor layer 40 formed on the intermediate insulating region is the oxide semiconductor region 42.

Thereafter, similarly to the basic structure of the TFT according to the first preferred embodiment, the oxide semiconductor layer 40, the source electrode 51, the drain electrode 52, and the interlayer insulating film 8 are formed.

In the TFT according to the second modified example of the first preferred embodiment, the forming region of the gate insulating film 21B (the first gate insulating film) other than the insulating laminated region where the gate insulating films 21B and 23B are laminated is the first insulating region, and a region of the forming region of the gate insulating film 23B (the second gate insulating film) formed on the gate insulating film 21B to be formed on the insulating substrate 10 is the second insulating region. The gate insulating film corresponding to the gate insulating film 20 (FIG. 1) is formed of the laminated structure of the gate insulating films 21B and 23B. As a result, the second modified example of the first preferred embodiment realizes the structure for producing the first and second effects similarly to the basic structure according to the first preferred embodiment.

At this time, the hydrogen contents of the first insulating region and the second insulating region satisfy the condition A and the condition B. The sheet resistances of the oxide semiconductor regions 41 and 43 satisfy the condition C1 and the condition C3. Further, the sheet resistances R1 to R3 of the oxide semiconductor regions 41 to 43 satisfy the relationship such that R1>R2>R3.

Further, the second modified example of the first preferred embodiment produces a third effect such that provision of the oxide semiconductor region 42 that satisfies the condition C2 between the oxide semiconductor regions 41 to 43 restrains deterioration in the operating characteristic of the thin film transistor similarly to the basic structure according to the first preferred embodiment.

Second Preferred Embodiment

Figure 14:
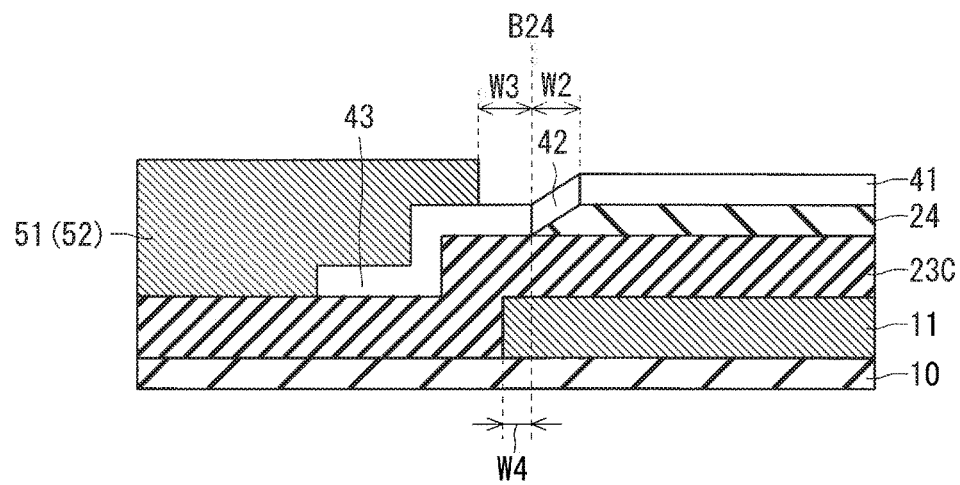
FIG. 14 is a cross-sectional view illustrating a detailed structure of the TFT according to a second preferred embodiment of the present invention.
Figure 15:
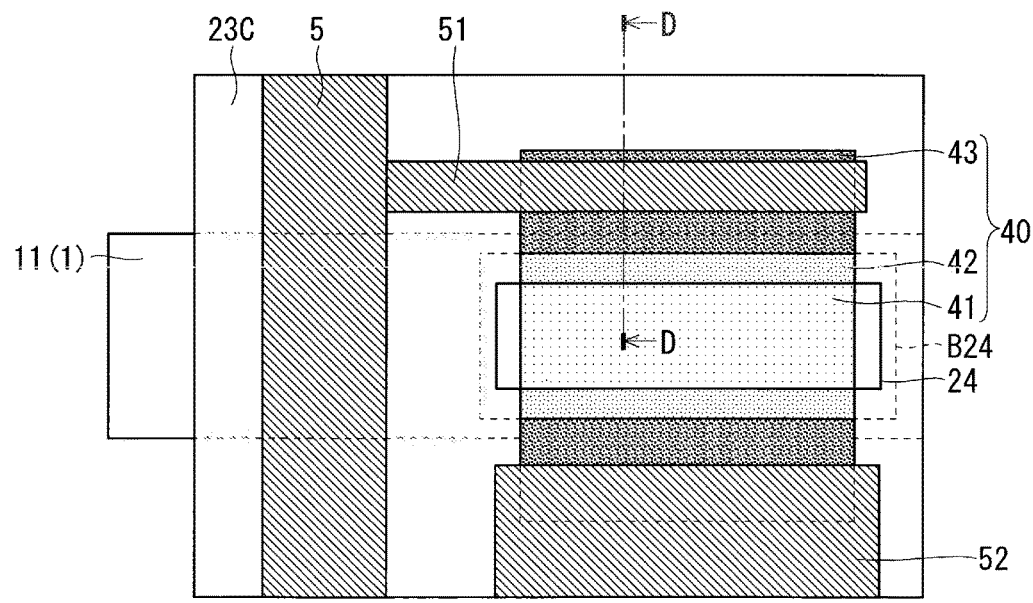
FIG. 15 is a plan view schematically illustrating a planar structure of the TFT according to the second preferred embodiment.

FIG. 14 is a cross-sectional view illustrating a detailed structure of a TFT according to a second preferred embodiment of the present invention. FIG. 15 is a plan view schematically illustrating a planar structure of the TFT according to the second preferred embodiment. A D-D cross section in FIG. 15 corresponds to the structure shown in FIG. 14. Also the TFT according to the second preferred embodiment corresponds to the switching transistor T1 shown in FIG. 3 similarly to the first preferred embodiment. The following description about the TFT according to the second preferred embodiment mainly refers to a TFT forming region.

A gate electrode 11 made of the first conductive film s formed on an insulating substrate 10. A gate insulating film 23C (a first gate insulating film) that is formed of a silicon nitride film that has comparatively high hydrogen content and satisfies, for example, a condition B is formed on an entire surface of the insulating substrate 10 and partially on the gate electrode 11 so as to cover the gate electrode 11.

A gate insulating film 24 (a second gate insulating film) is formed on a region inside the gate electrode 11 in a planar view on an upper layer of the gate insulating film 23C. The gate insulating film 24 is made of an Al oxide film that has low hydrogen permeability (a hydrogen permeability coefficient) and satisfies, for example, a condition D to be described below. In FIG. 14 and FIG. 15, B24 represents a bottom end of the gate insulating film 24. The hydrogen content of the gate insulating film 24 is set so as to be sufficiently lower than the hydrogen content of the gate insulating film 23C.

The condition D that defines the hydrogen permeability (the hydrogen permeability coefficient) is as follows.

The condition D: "$1\times10^{-25}$ mol/cm/sec/KPa$^{0.5}$@600K" or less.

In the condition D, "@600K" means a temperature environment of 600 K.

As described above, since the gate insulating film 24 is set to a level that satisfies the condition D and to the low hydrogen permeability, the gate insulating film 24 has a hydrogen permeation preventing characteristic such that the hydrogen in the gate insulating film 23C rarely passes through the gate insulating film 24.

A pattern of an oxide semiconductor layer 40 (oxide semiconductor regions 41 to 43) is formed on the gate insulating films 23C and 24 so as to cross the gate electrode 11. The oxide semiconductor region 41 formed on the gate insulating film 24 has high resistance at a level which satisfies, for example, the condition C1. The oxide semiconductor region 43 formed on the gate insulating film 23C on a region from which the gate insulating film 24 is removed has low resistance at a level which satisfies, for example, the condition C3. As shown in FIG. 14, when an end of the gate insulating film 24 has a tapered region (a slope) whose sectional shape is a tapered slope shape, the oxide semiconductor region 42 on the tapered region has resistance that is intermediate between the resistances of the oxide semiconductor region 41 and the oxide semiconductor region 43 so that, for example, the condition C2 is satisfied.

A source electrode 51 and a drain electrode 52 are partially formed on the oxide semiconductor region 43 so as to be electrically connected to the oxide semiconductor region 43 and be separated from the oxide semiconductor region 41.

In the TFT according to the second preferred embodiment, a first insulating region (the gate insulating film 24) has a hydrogen related characteristic having the hydrogen permeation preventing characteristic at a level such that the permeation of the hydrogen from the gate insulating film 23C that satisfies the condition B and has the comparatively large hydrogen content is restrained.

In the TFT according to the second preferred embodiment, a forming region of the gate insulating film 24 (a second gate insulating film) is the first insulating region, and a forming region of the gate insulating film 23C other than an insulating laminated region where the gate insulating film 23C (the first gate insulating film) and the gate insulating film 24 are laminated is a second insulating region.

The TFT according to the second preferred embodiment can produce the first and the second effects similarly to the first preferred embodiment when the gate insulating film corresponding to the gate insulating film 20 shown in FIG. 1 is formed into the laminated structure of the gate insulating film 23C and the gate insulating film 24.

Further, since the gate insulating film 24 in the TFT according to the second preferred embodiment has the hydrogen permeation preventing characteristic that satisfies the condition D such that the hydrogen permeability is sufficiently low, hydrogen contained in the gate insulating film 23C on a lower layer of the gate insulating film 24 can be effectively restrained from moving to the oxide semiconductor region 41 of the oxide semiconductor layer 40 serving as a channel region. Therefore, the oxide semiconductor region 41 of the oxide semiconductor layer 40 is maintained at high resistance, and the TFT according to the second preferred embodiment can realize a switching operation that is more stable than the switching operation in the TFT according to the first preferred embodiment.

The Al oxide film is used as the gate insulating film 24, but an Al nitride film, a Ta oxide film, a Ti oxide film, a Zr oxide film, an SrTiO$_3$ film, and the like may be used as the insulating film having the hydrogen permeation preventing characteristic.

Further, in the planar structure shown in FIG. 15, the gate insulating film 24 is formed into an island-shaped pattern, but the pattern may extend in a direction parallel with the gate electrode pattern similarly to the TFT according to the first preferred embodiment shown in FIG. 5.

Figure 16:
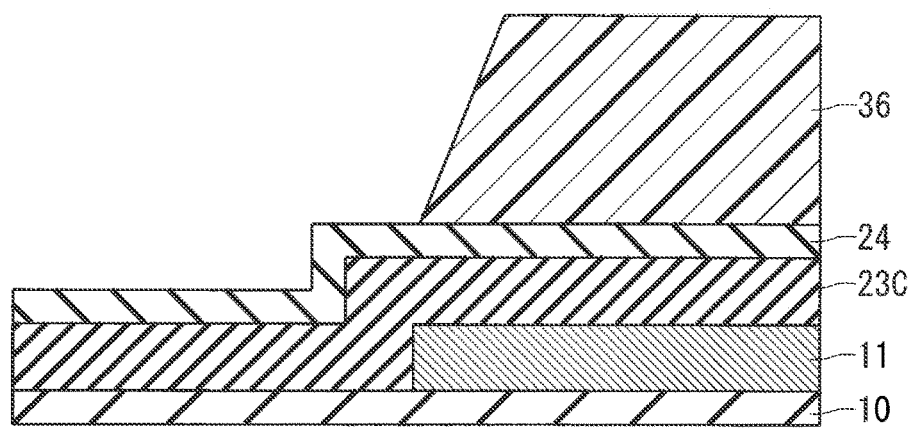
FIG. 16 is a cross-sectional view illustrating a part of a manufacturing method according to the second preferred embodiment.
Figure 17:
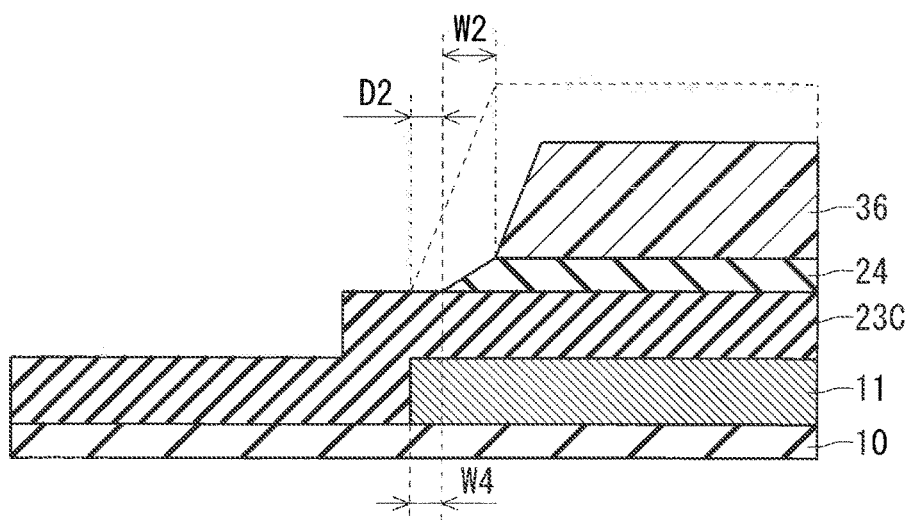
FIG. 17 is a cross-sectional view illustrating a part of the manufacturing method according to the second preferred embodiment.

FIG. 16 and FIG. 17 are cross-sectional views illustrating a part of a manufacturing method according to the second preferred embodiment. The TFT manufacturing method according to the second preferred embodiment is described below suitably with reference to FIG. 16 and FIG. 17. Description about portions in the second preferred embodiment overlapped with the first preferred embodiment is suitably omitted, and characteristic portions in the second preferred embodiment are mainly described.

After the gate electrode 11 is formed by the method similar to the first preferred embodiment, an SiN film having a thickness of 400 nm is formed as the gate insulating film 23C by using, for example, a CVD method, and then an Al oxide film is formed as the gate insulating film 24 by using, for example, an MOCVD method.

After the above film formation, as shown in FIG. 16, the rear surface is exposed by using the gate electrode 11 as a mask and the front surface is exposed by using a mask that blocks light in a direction perpendicular to the gate electrode 11 and is developed. As a result, a resist 36 having a resist pattern for forming the gate insulating film 24 is obtained inside the pattern of the gate electrode 11.

The exposed gate insulating film 24 is etched by using the resist 36 as a mask and using BCl$_3$+Cl$_2$+O$_2$-based gas. At this time, as shown FIG. 17, also the resist is simultaneously retreated by a distance D2+W2 in a retreating direction by an effect of O$_2$ gas addition, so that the tapered region having a slop shape can be formed on the pattern end of the gate insulating film 24.

For example, the InGaZnO-based oxide semiconductor layer 40 having a thickness of 50 nm is formed by using a sputtering method, and after resist patterning, wet etching is performed by using, for example, an oxalic etching liquid. Thereafter, the resist is removed.

Thereafter, when the annealing process is performed at a temperature of, for example, 350° C., an electrical damage in the oxide semiconductor layer 40 is reduced, the hydrogen included in the SiN film moves to the oxide semiconductor layer 40 that contacts with the gate insulating film 23C, and reduction is caused in the oxide semiconductor layer 40. As a result, the oxide semiconductor region 43 whose resistance is reduced can be obtained.

On the other hand, the gate insulating film 24 prevents the hydrogen from moving to the oxide semiconductor layer 40 on the insulating film 24 formed on the gate electrode 11. For this reason, the oxide semiconductor layer 40 serves as the oxide semiconductor region 41 where the high resistance is maintained. Further, when the end of the gate insulating film 24 has the tapered region having a slope shape, a hydrogen movement preventing effect is diversified so that the oxide semiconductor region 42 having intermediate resistance is formed. As a result, the TFT operation can be stabilized by restraining concentration of an electric field at the channel end.

That is to say, in the TFT according to the second preferred embodiment, the oxide semiconductor region 42 is provided between the oxide semiconductor regions 41 and 43, so that the concentration of the electric field on the boundary between the channel region and the source region and between the channel region and the drain region can be relieved similarly to the first preferred embodiment. As a result, a third effect such that deterioration in the operating characteristic of the thin film transistor is restrained is produced.

Since the following manufacturing method is similar to the TFT manufacturing method according to the first preferred embodiment, description thereof is omitted.

The TFT manufacturing method according to the second preferred embodiment produces an effect such that a change in the operating characteristic of the TFT caused by a fluctuation in the dry process can be also restrained. This is because the TFT is protected by the resist 36, and thus thinning of a thickness of the gate insulating film under the channel region depending on an etching selection ratio during the process does not occur.

That is to say, like the first preferred embodiment (see FIG. 10 and FIG. 11), the gate insulating films 21B (21) and 23B (23) are obtained, and a residual film of the gate insulating film 21B fluctuates due to the fluctuation in the selection ratio of the etching. As a result, an influence might be exerted upon the operating characteristic of the TFT according to the first preferred embodiment. On the contrary, in the second preferred embodiment (see FIG. 16 and FIG. 17), even when the selection ratio of the etching fluctuates, a portion that functions as the gate insulating film corresponding to the channel region is covered with the resist 36, and thus the film thickness does not change. As a result, the TFT manufacturing method according to the second preferred embodiment has no influence upon the operating characteristic of the TFT.

The above description refers to that the gate insulating film 23C is structured as a single layer, but the gate insulating film 23C may be structured by taking into consideration film quantity of an interface of the gate electrode 11. For example, in such a structure, a laminated film is formed of an SiN film formed as a lower layer at a high temperature and an. SiN film formed as an upper layer at a low temperature. In another manner, a laminated film is formed of an SiN film as a lower layer and an SiO$_2$ film as an upper layer. Further, in such a structure, an exposed upper layer of the laminated film of the gate insulating film 23C or a part of the laminated film may be etched and removed simultaneously during the patterning of the gate insulating film 24.

Third Preferred Embodiment

Figure 18:
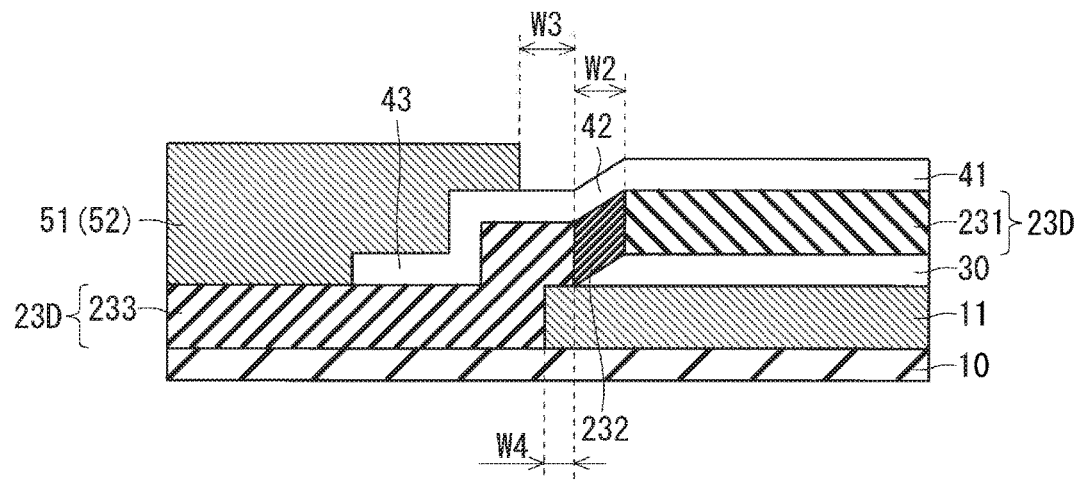
FIG. 18 is a cross-sectional view illustrating a detailed structure of the TFT according to a third preferred embodiment of the present invention.
Figure 19:
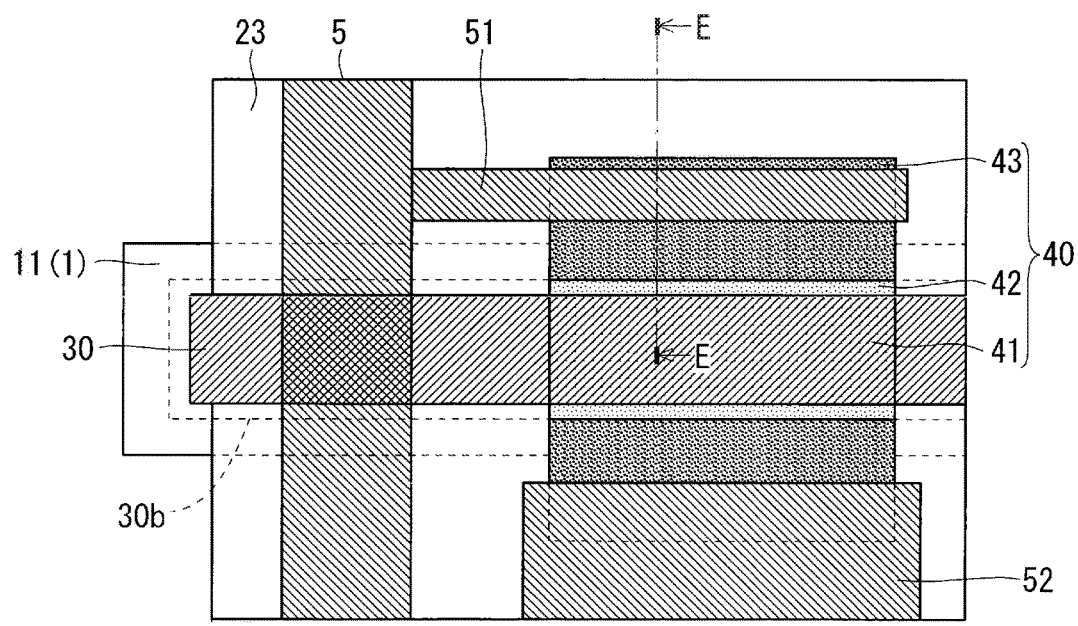
FIG. 19 is a plan view schematically illustrating a planar structure of the TFT according to the third preferred embodiment.

FIG. 18 is a cross-sectional view illustrating a detailed structure of a TFT according to a third preferred embodiment of the present invention. FIG. 19 is a plan view schematically illustrating a planar structure of the TFT according to the third preferred embodiment. An E-E cross section in FIG. 19 corresponds to the structure shown in FIG. 18. Also the TFT according to the third preferred embodiment corresponds to the switching transistor T1 shown in FIG. 3 and the like similarly to the first preferred embodiment. The following description about the TFT according to the third preferred embodiment mainly refers to a TFT forming region.

A gate electrode 11 made of a first conductive film is formed on an insulating substrate 10, and a hydrogen absorbing film (a hydrogen storage film) 30 made of, for example, Ti alloy is formed on a region contained in the gate electrode 11 in a planar view. It is desirable that a pattern end of the hydrogen absorbing film 30 is structured so as to have a tapered region whose sectional shape is tapered as shown in FIG. 18.

A gate insulating film 23D (insulating regions 231 to 233) is formed of, for example, an SiN film so as to cover the gate electrode 11 and the hydrogen absorbing film 30. The insulating region 231 (a first insulating region) of the gate insulating film 23D on the hydrogen absorbing film 30 is lower in hydrogen content than the insulating region 233 (the second insulating region) that is nor formed with the hydrogen absorbing film 30 in a lower position of the gate insulating film 23D. When a pattern end of the hydrogen absorbing film 30 has a tapered region having a slope shape, hydrogen content of the insulating region 232 (an intermediate insulating region) of the gate insulating film 23D formed on the tapered region has an intermediate value between the hydrogen content of the insulating region 231 and the hydrogen content of the insulating region 233.

Therefore, the hydrogen content of the insulating region 231 is 0.2 (at %) or less that satisfies the condition A, and the hydrogen content of the insulating region 233 is in a range of 10 to 35 (at %) that satisfies the condition B. Further, the hydrogen content of the insulating region 232 has the intermediate value between the values of the insulating regions 231 and 233. The gate insulating film 23D has a hydrogen related characteristic such that the hydrogen content of the first insulating region is lower than the hydrogen content of the second insulating region.

An oxide semiconductor layer 40 (oxide semiconductor regions 41 to 43) is formed on an upper layer of the gate insulating film 23D across the gate electrode 11. The oxide semiconductor region 41 formed on the insulating region 231 of the gate insulating film 23D has high resistance at a level that satisfies, for example, the condition C1. The oxide semiconductor region 43 formed on the insulating region 233 has low resistance at a level that satisfies, for example, the condition C3. The oxide semiconductor region 42 formed on the insulating region 232 of the gate insulating film 23D has resistance that is intermediate between the resistances of the oxide semiconductor regions 41 and 43 with the condition C2 being satisfied, for example.

A source electrode 51 and the drain electrode 52 are partially formed on the oxide semiconductor region 43 so as to be electrically connected to the oxide semiconductor region 43 and be separated from the oxide semiconductor region 41.

In the TFT according to the third preferred embodiment having such a structure, the insulating region 231 to be formed on the hydrogen absorbing film 30 in a forming region of the gate insulating film 23D is the first insulating region, and the insulating region 233 to be formed on a region other than the hydrogen absorbing film 30 in the forming region of the gate insulating film 23D is the second insulating region. As a result, the laminated structure of the hydrogen absorbing film 30 and the gate insulating film 23D can produce the first and second effects similarly to the first preferred embodiment and the second preferred embodiment.

At this time, the hydrogen contents of the insulating region 231 (the first insulating region) and the insulating region 233 (the second insulating region) satisfy the condition A and the condition B. The sheet resistances of the oxide semiconductor regions 41 and 43 satisfy the condition C1 and the condition C3. Further, the sheet resistances R1 to R3 of the oxide semiconductor regions 41 to 43 satisfy the relationship such that R1>R2>R3.

Further, since the TFT according to the third preferred embodiment has the above structure, hydrogen that moves to a channel region can be captured by the hydrogen absorbing film 30. As a result, a change in electric conductivity of the oxide semiconductor region 41 caused by a process during post steps after completion of a TFT array substrate and a usage environment after completion of a display device can be restrained. This TFT produces an effect that exceeds the effect in the first preferred embodiment.

Ti alloy is used as the hydrogen absorbing film 30, but V alloy, Ni alloy, Mn alloy, Mg alloy, an $Si_2N_2O$ film, an SiAlON film, or the like may be used instead.

A TFT manufacturing method according to the third preferred embodiment is described below. Description about portions overlapped with the first preferred embodiment is suitably omitted, and characteristic portions in the third preferred embodiment are mainly described.

For example, a film of the Al alloy having a thickness of 200 nm is formed as the first conductive film, and then, for example, the Ti alloy film having a thickness of 100 nm is formed as the hydrogen absorbing film 30. After a resist for patterning the gate electrode is formed and the Ti alloy film is etched by using a hydrogen peroxide-based etching liquid, the Al alloy is etched by using a phosphate/nitrate/acetic etching liquid and second etching is performed by using the hydrogen peroxide-based etching liquid. As a result, an overhung portion of the Ti alloy is removed and the Ti alloy is retreated to a region where the Ti alloy is contained in the gate electrode 11. Thereafter, the resist is removed, so that the patterns of the gate electrode 11 and the hydrogen absorbing film 30 are formed.

The SiN film having a thickness of 400 nm is formed as the gate insulating film 23D by using, for example, a CVD method, but the SiN film on the hydrogen absorbing film 30 hardly absorbs hydrogen during the film formation. For this reason, the insulating region 231 with the low hydrogen content (that satisfies the condition A) is formed. On the other hand, a region separated from the hydrogen absorbing film 30 serves as the insulating region 233 that absorbs hydrogen (that satisfies the condition B).

An InGaZnO-based oxide semiconductor layer 40 having a thickness of 50 nm is formed by a sputtering method, and after resist patterning, wet etching is performed by using, for example, an oxalic etching liquid. Thereafter, the resist is removed. Then, when the annealing process is performed at a temperature of, for example, 350° C., an electrical damage in the oxide semiconductor layer 40 is reduced, and hydrogen contained in the SiN film moves to the oxide semiconductor layer 40 on the region contacting with the insulating region 233. As a result, reduction is caused in the oxide semiconductor layer 40 so that the oxide semiconductor region 43 with low resistance is obtained.

On the other hand, the oxide semiconductor layer 40 on the insulating region 231 of the gate insulating film 23D formed on the gate electrode 11 serves as the oxide semiconductor region 41 where the high resistance is maintained because the hydrogen to be moved is reduced.

Further, when the end of the hydrogen absorbing film 30 has the tapered region having a slope shape, the oxide semiconductor layer 40 on the tapered region serves as the oxide semiconductor region 42 whose resistance is intermediate between the resistances of the oxide semiconductor regions 41 and 42. Presence of the oxide semiconductor region 42 restrains concentration of an electric field at the channel end so that the operation of the TFT according to the third preferred embodiment can be stabilized.

The rest of the manufacturing process is similar to the first preferred embodiment and the second preferred embodiment, description thereof is omitted.

Figure 20:
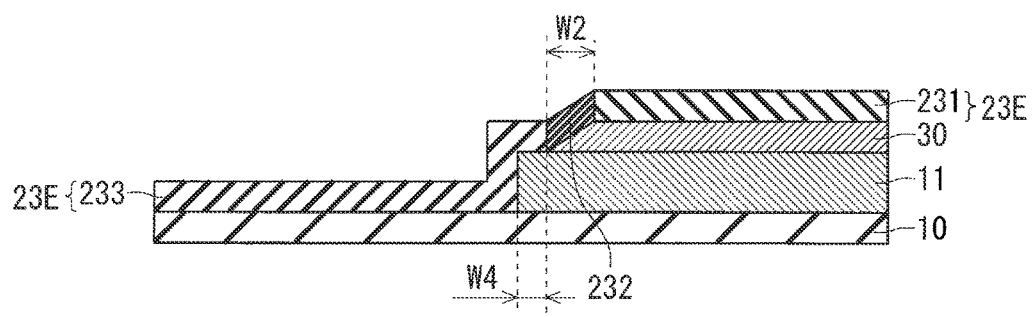
FIG. 20 is a cross-sectional view illustrating a sectional structure according to a modified example of the third preferred embodiment.
Figure 21:
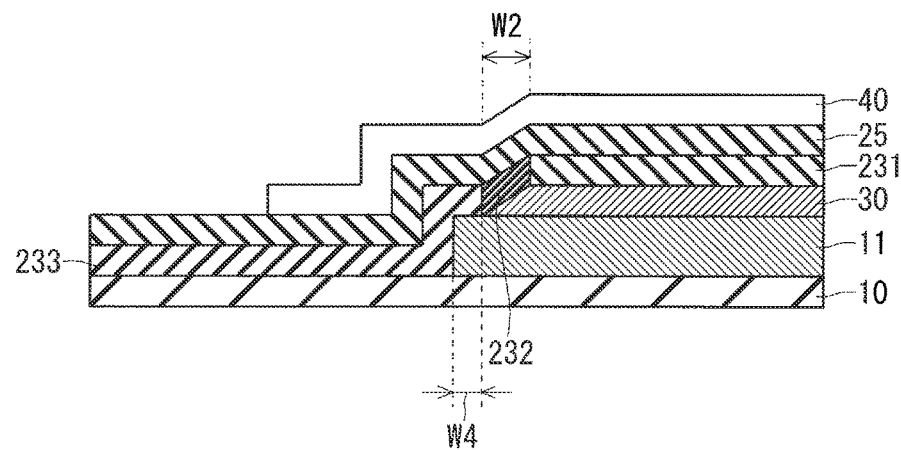
FIG. 21 is a cross-sectional view illustrating a sectional structure according to the modified example of the third preferred embodiment.

FIG. 20 to FIG. 22 are cross-sectional views illustrating a cross-sectional structure according to a modified example of the third preferred embodiment. In the basic structure according to the third preferred embodiment shown in FIG. 18 and FIG. 19, the gate insulating film 23D is formed as one layer.

On the other hand, as shown in FIG. 20, a gate insulating film 23E formed of an SiN film whose hydrogen content varies depending on forming positions due to an influence of the hydrogen absorbing film 30 is formed to have a thickness of, for example, 200 nm. Thereafter, as shown in FIG. 21, a gate insulating film 25 formed of an $SiO_2$ film with low hydrogen content, for example, is formed, so that a gate insulating film of the laminated structure is obtained.

Thereafter, hydrogen contained in the gate insulating film 23E is moved to the gate insulating film 25 during annealing of the oxide semiconductor layer 40, so that gate insulating film 25 having hydrogen content according to respective regions (insulating regions 251 to 253) and the oxide semiconductor layer 40 having resistance according to respective regions (the oxide semiconductor regions 41 to 43) may be obtained as shown in FIG. 22.

In the modified example of the third preferred embodiment shown in FIG. 20 to FIG. 22, the resistance can be further restrained from changing due to the movement of the hydrogen in the oxide semiconductor region 41 serving as the channel region by the lamination of the gate insulating film including the gate insulating films 23E and 25.

This is because, like the basic structure according to the third preferred embodiment, when the gate insulating film 23D is thickened as a single layer, the hydrogen absorbing film 30 makes trapping of hydrogen difficult, and thus the lower layer (the gate insulating film 23E) is thinned by lamination to makes trapping of hydrogen from the hydrogen absorbing film 30 easy, and the hydrogen content of the upper layer (the gate insulating film 25) can be sufficiently low.

Fourth Preferred Embodiment

Figure 24:
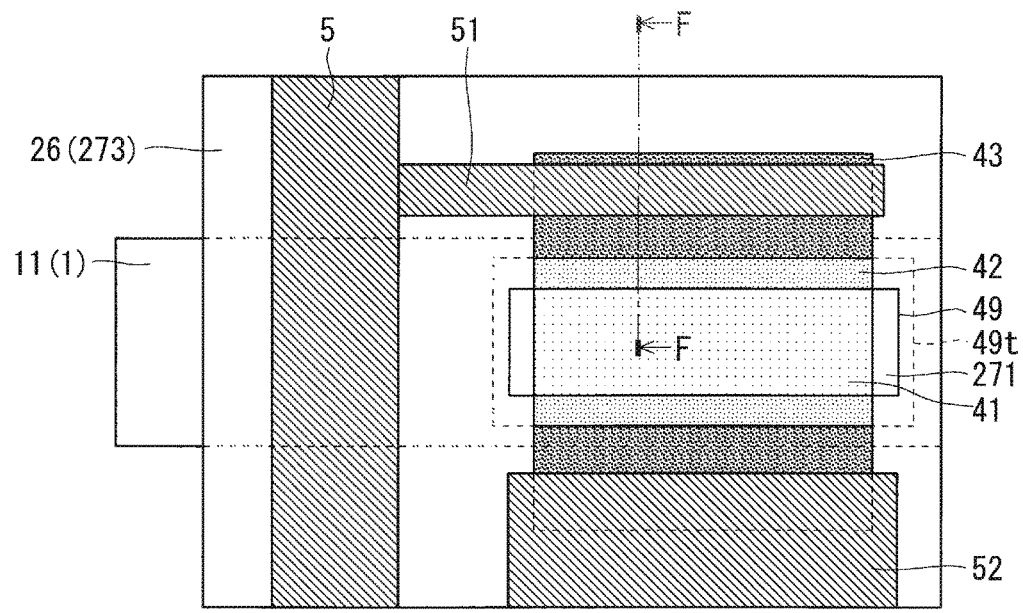
FIG. 24 is a plan view schematically illustrating a planar structure of the TFT according to the fourth preferred embodiment.

FIG. 23 is a cross-sectional view illustrating a detailed structure of a TFT according to a fourth preferred embodiment of the present invention. FIG. 24 is a plan view schematically illustrating a planar structure of the TFT according to the fourth preferred embodiment. An F-F cross section in FIG. 24 corresponds to the structure shown in FIG. 23. Also the TFT according to the fourth preferred embodiment corresponds to the switching transistor T1 shown in FIG. 3 similarly to the first preferred embodiment. The following description about the TFT according to the fourth preferred embodiment mainly refers to a TFT forming region.

A gate insulating film 26 (a first gate insulating film) formed of a silicon nitride film that has high hydrogen content and satisfies, for example, a condition B is formed over an insulating substrate 10 through an end of a gate electrode 11. A partial surface of the gate electrode 11 is exposed from a gate insulating film 26 by an opening 49 included in the gate electrode 11. A shape of the opening 49 desirably has a slope shape such that its height becomes higher toward an opening upper end portion 49t. That is to say, as shown in FIG. 23, an end of the gate insulating film 26 to be formed on an end of the gate electrode 11 desirably has a tapered region whose sectional shape is tapered.

Then, a gate insulating film 27 (a second gate insulating film) is formed on the gate electrode 11 and gate insulating film 26. Therefore, the gate insulating film 26 and the gate electrode 11 exposed through the opening 49 are covered with the gate insulating film 27, and an insulating region 271

(a first insulating region) that has low hydrogen content and satisfies, for example, the condition A is formed inside the opening 49.

On the other hand, gate insulating films 26 and 27 are laminated, and an insulating region 273 (a second insulating region) that has high hydrogen content and satisfies, for example, a condition B1, described later, is formed on a region outside the opening upper end portion 49t of the opening 49. Further, an insulating region 272 (an intermediate insulating region) whose hydrogen content is intermediate is formed on a side surface region of the opening 49 (a region of the gate insulating film 27 indicated by a distance W2).

The condition B1 is as follows.

The Condition B1: the hydrogen content is within a range of 1 to 35 (at %).

In the TFT according to the fourth preferred embodiment, the insulating region 273 of the forming region of gate insulating film 27 corresponding to an insulating laminated region (excluding the intermediate insulating region) where the gate insulating films 26 and 27 are laminated is the second insulating region, and the insulating region 271 of the forming region of the gate insulating film 27 formed on a region other than the insulating laminated region is the first insulating region. A hydrogen related characteristic is such that the hydrogen content of the first insulating region is lower than the hydrogen content of the second insulating region.

An oxide semiconductor layer 40 is formed on the upper layer of the gate insulating film 27 so as to cross the gate electrode 11. The oxide semiconductor region 41 of the oxide semiconductor layer 40 formed on the insulating region 271 of the gate insulating film 27 has high resistance at a level that satisfies, for example, the condition C1. The oxide semiconductor region 43 formed on the insulating region 273 has low resistance at a level that satisfies, for example, the condition C3. Further, the oxide semiconductor region 42 formed on the insulating region 272 has resistance that is intermediate between the resistances of the oxide semiconductor regions 41 and 43 with the condition C2 being satisfied, for example.

A source electrode 51 and a drain electrode 52 are partially formed on the oxide semiconductor region 43 so as to be electrically connected to the oxide semiconductor region 43 and be separated from the oxide semiconductor region 41.

In the TFT according to the fourth preferred embodiment having such a structure, the insulating region 273 of the forming region of gate insulating film 27 corresponding to an insulating laminated region where the gate insulating films 26 and 27 are laminated is the second insulating region, and the insulating region 271 of the forming region of gate insulating film 27 formed on a region other than the insulating laminated region is the first insulating region. A gate insulating film corresponding to the gate insulating film 20 (see FIG. 1) is formed of the laminated structure of the gate insulating films 26 and 27. As a result, the TFT according to the fourth preferred embodiment produces the first and second effects similarly to the first preferred embodiment to the third preferred embodiment.

At this time, the hydrogen contents of the insulating region 271 (the first insulating region) and the insulating region 273 (the second insulating region) satisfy the condition A and the condition B1, and sheet resistances of the oxide semiconductor regions 41 and 43 satisfy the condition C1 and the condition C3. Further, the sheet resistances R1 to R3 of the oxide semiconductor regions 41 to 43 satisfy the relationship such that R1>R2>R3.

Further, the structure of the TFT according to the fourth preferred embodiment produces an effect such that a change in the operating characteristic of the TFT caused by a fluctuation in the dry process can be restrained similarly to the second preferred embodiment. This is because a film thickness of the gate insulating film of the channel region is not thinned according to an etching selection ratio. Further, the end of the gate electrode 11 has a two-layered insulating film structure, so that yield can be improved similarly to the first preferred embodiment.

FIG. 25 to FIG. 28 are cross-sectional views illustrating a part of the manufacturing method according to the fourth preferred embodiment. The TFT manufacturing method according to the fourth preferred embodiment is described below suitably with reference to FIG. 25 to FIG. 28. Portions overlapped with the first preferred embodiment are suitably omitted, and characteristic portions in the fourth preferred embodiment are mainly described.

Figure 25:
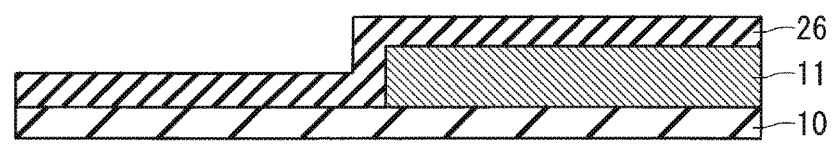
FIG. 25 is a cross-sectional view illustrating a part of the manufacturing method according to the fourth preferred embodiment.

After the gate electrode 11 is formed on the insulating substrate 10, as shown in FIG. 25, an SiN film having a thickness of 200 nm and high hydrogen content is formed as the gate insulating film 26 by using, for example, a CVD method.

Figure 26:
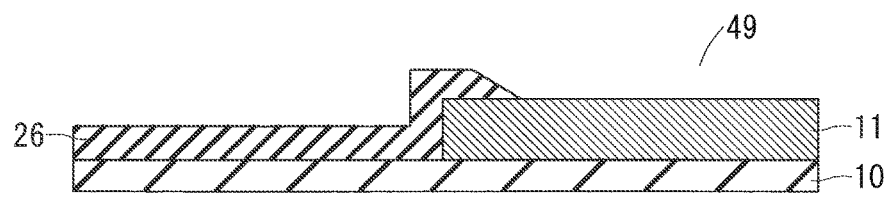
FIG. 26 is a cross-sectional view illustrating a part of the manufacturing method according to the fourth preferred embodiment.

Thereafter, as shown in FIG. 26, the opening 49 is formed by using a method similar to the method for forming the opening 39 (FIG. 5) and the opening 48 (FIG. 13) according to the first and second modified examples of the first preferred embodiment.

Figure 27:
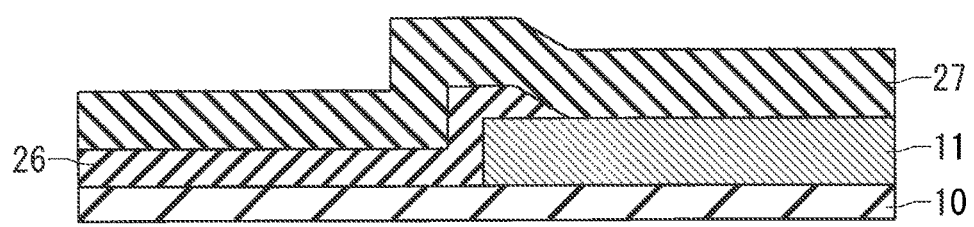
FIG. 27 is a cross-sectional view illustrating a part of the manufacturing method according to the fourth preferred embodiment.

As shown in FIG. 27, an $SiO_2$ film having a thickness of 300 nm and low hydrogen content is formed as the gate insulating film 27.

Figure 28:
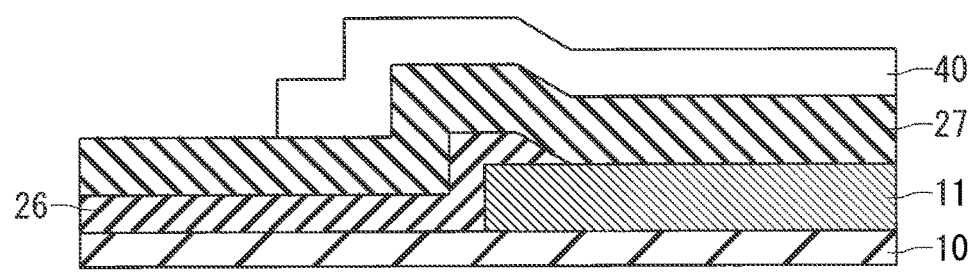
FIG. 28 is a cross-sectional view illustrating a part of the manufacturing method according to the fourth preferred embodiment.

As shown in FIG. 28, an InGaZnO-based oxide semiconductor layer 40 having a thickness of 50 nm is formed by a sputtering method, and after resist patterning, wet etching is performed by using, for example, an oxalic etching liquid. Thereafter, the resist is removed.

Thereafter, for example, when the annealing process is performed at a temperature of 350° C., the electrical damage in the oxide semiconductor layer 40 is reduced, and the hydrogen moves to the gate insulating film 27 on a region that contacts with gate insulating film 26 so that the insulating region 273 is formed. Further, the oxide semiconductor layer 40 is reduced by the moved hydrogen so that the oxide semiconductor region 43 of low resistance is obtained.

On the other hand, the gate insulating film 27 formed in the opening 49 on the gate electrode 11 becomes the insulating region 271 having low hydrogen content because an influence of the hydrogen from the gate insulating film 26 is not exerted on the gate insulating film 27. Further, the oxide semiconductor layer 40 on the insulating region 271 becomes the oxide semiconductor region 41 where high resistance is maintained because hydrogen does not move.

Further, when the opening 49 of the gate insulating film 26 has a slope shape, namely, the end of the gate insulating film 26 formed on the gate electrode 11 has the tapered region, the insulating region 272 having intermediate hydrogen content and the oxide semiconductor region 42 having intermediate resistance are formed by diversifying the amount of the movement of hydrogen from gate insulating film 26. As a result, the TFT operation can be stabilized by restraining concentration of an electric field on the channel end.

That is to say, in the TFT according to the fourth preferred embodiment, the oxide semiconductor region 42 is provided between the oxide semiconductor regions 41 and 43, so that the concentration of the electric field on the boundary between the channel region and the source region and between the channel region and the drain region can be relieved similarly to the first to third preferred embodiments. As a result, a third effect such that deterioration in the operating characteristic of the thin film transistor is restrained is produced.

Since the following manufacturing method is similar to the method in the first preferred embodiment, description thereof is omitted.

MODIFIED EXAMPLE

FIG. 29 to FIG. 32 are cross-sectional views illustrating a cross-sectional structure according to a modified example of the fourth preferred embodiment. A TFT forming region is mainly described below.

Figure 29:
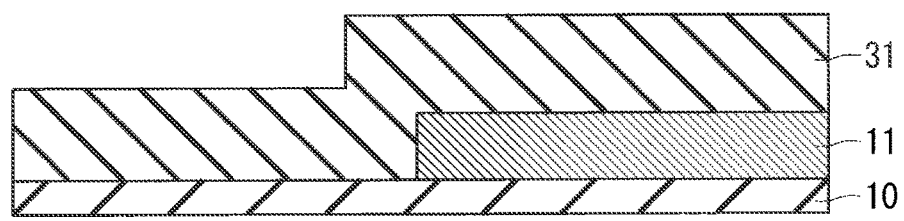
FIG. 29 is a cross-sectional view illustrating a sectional structure according to a modified example of the fourth preferred embodiment.

As shown in FIG. 29, an Al alloy film having a thickness of 200 nm is used as the first conductive film, and after the gate electrode 11 is formed, an SiN film having high hydrogen content and a thickness of 200 nm+α is formed as an insulating film 31 (a first gate insulating film) by using for example, a CVD method. "α" means a margin to make the insulating film 31 certainly thicker than the gate electrode 11 even if a process fluctuation occurs.

Figure 30:
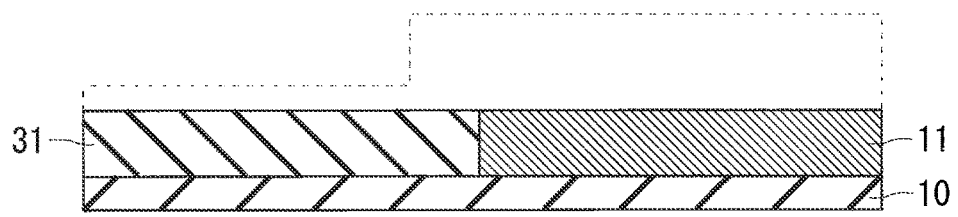
FIG. 30 is a cross-sectional view illustrating a sectional structure according to the modified example of the fourth preferred embodiment.

Thereafter, as shown in FIG. 30, after the film formation, the insulating film 31 is subjected to a flattening process by using a CMP method and the like so that the surface of the gate electrode 11 is exposed. As a result, a forming height of the insulating film 31 is equivalent to a forming height of the gate electrode 11.

Figure 31:
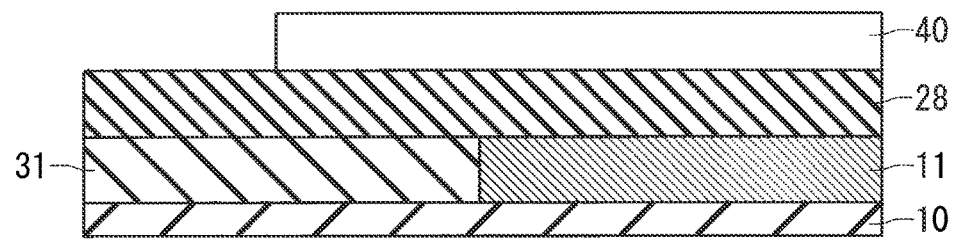
FIG. 31 is a cross-sectional view illustrating a sectional structure according to the modified example of the fourth preferred embodiment.

As shown in FIG. 31, the gate insulating film 28 (a second gate oxide film) is formed of an $SiO_2$ film with low hydrogen content by using for example, the CVD method, and then, the oxide semiconductor layer 40 is formed so as to be patterned.

Figure 32:
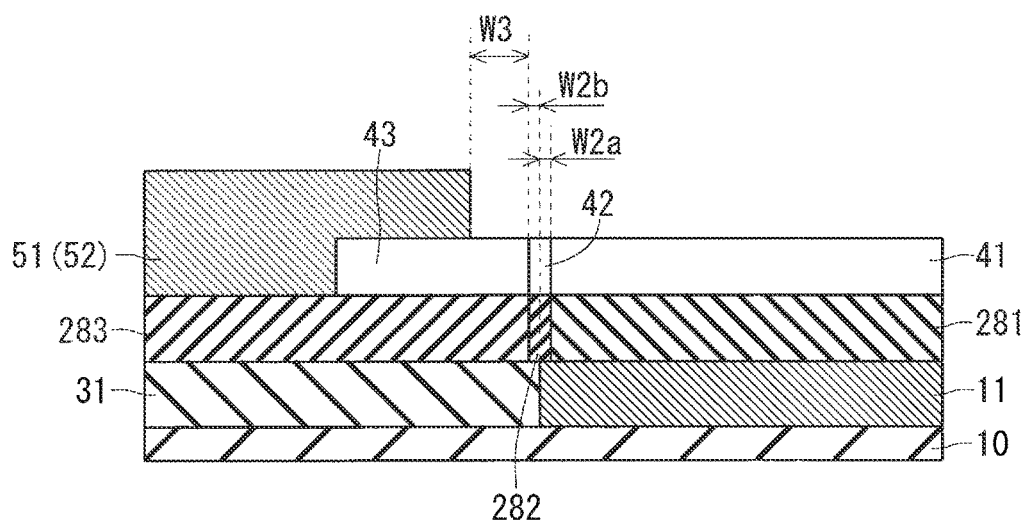
FIG. 32 is a cross-sectional view illustrating a sectional structure according to the modified example of the fourth preferred embodiment.

Thereafter, as shown in FIG. 32, when the annealing process is performed at a temperature of, for example, 350° C., an electrical damage in the oxide semiconductor layer 40 is reduced, and hydrogen moves to the gate insulating film 28 on a region that contacts with the insulating film 31. As a result, the gate insulating film 28 becomes an insulating region 283 with high hydrogen content, and the oxide semiconductor layer 40 formed on the insulating region 283 is reduced by the hydrogen moved from the insulating region 283 so as to become an oxide semiconductor region 43 with low resistance.

On the other hand, the gate insulating film 28 formed on the gate electrode 11 becomes an insulating region 281 having low hydrogen content because an influence of the hydrogen from the insulating film 31 is not exerted on the gate insulating film 28. Further, the oxide semiconductor layer 40 on the insulating region 281 becomes an oxide semiconductor region 41 where high resistance is maintained.

An insulating region 282 having intermediate hydrogen content in a diffusion length width of hydrogen and an oxide semiconductor region 42 having intermediate resistance are formed on the gate insulating film 28 on a boundary region between the gate electrode 11 and the insulating film 31 (a distance W2a (a side of the gate electrode 11)+W2b (a side of the insulating film 31)). For this reason, the oxide semiconductor region 41 with high resistance serving as the channel region is necessarily contained in the gate electrode 11.

Since a process hereinafter is similar to the above-mentioned manufacturing method, description thereof is omitted, but after a source electrode 51(52) and the like are formed, a structure shown in FIG. 32 is obtained.

The insulating film 31 and the gate insulating film 28 in the modified example of the fourth preferred embodiment shown in FIG. 32 have a characteristic equivalent to the characteristic in the gate insulating film 26 and the gate insulating film 27 in the basic structure according to the fourth preferred embodiment shown in FIG. 23 and FIG. 24 as the hydrogen related characteristic such as the hydrogen content. For this reason, the first to third effects are produced similarly to the basic structure.

The gate insulating film 28 should be thinned according to a difference in a dielectric constant caused by changing the gate insulating film 28 from SiN into $SiO_2$, but the thinning of the gate insulating film 28 causes a reduction in a withstand voltage. In the modified example of the fourth preferred embodiment, since a difference in level on the gate insulating film 28 at the end of the gate electrode 11 is eliminated and insulation breakdown on this portion can be restrained. For this reason, an effect that yield is improved can be obtained.

Thus, in the modified example of the fourth preferred embodiment, since the gate insulating film 28 as the second gate oxide film can be formed without a difference in level, the insulation breakdown of gate insulating film 28 at the portion with a difference in level can be restrained. For this reason, the effect that the yield can be improved is produced in addition to the first to third effects of the basic structure according to the fourth preferred embodiment.

Fifth Preferred Embodiment

Figure 33:
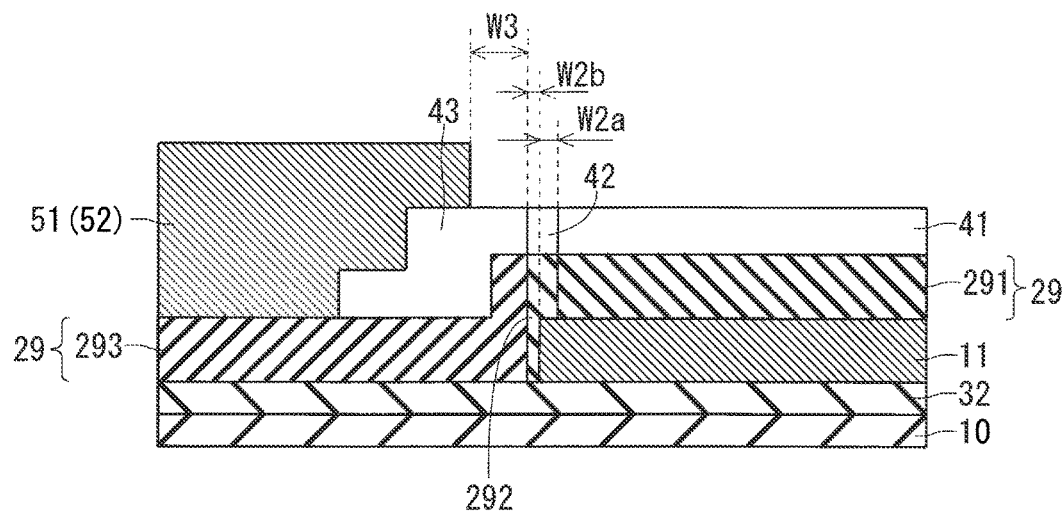
FIG. 33 is a cross-sectional view illustrating a detailed structure of the TFT according to a fifth preferred embodiment of the present invention.

FIG. 33 is a cross-sectional view illustrating a detailed structure of a TFT according to a fifth preferred embodiment of the present invention. Also the TFT according to the fifth preferred embodiment corresponds to the switching transistor T1 shown in FIG. 3 similarly to the first to fourth preferred embodiments. The following description about the TFT according to the fourth preferred embodiment mainly refers to a TFT forming region.

Figure 34:
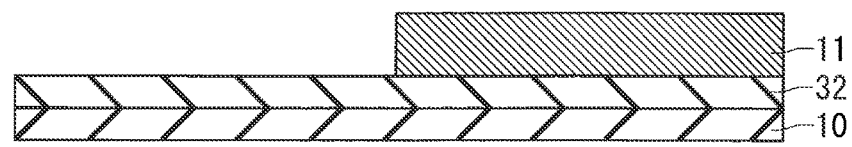
FIG. 34 is a cross-sectional view illustrating a part of a TFT manufacturing method according to the fifth preferred embodiment.
Figure 35:
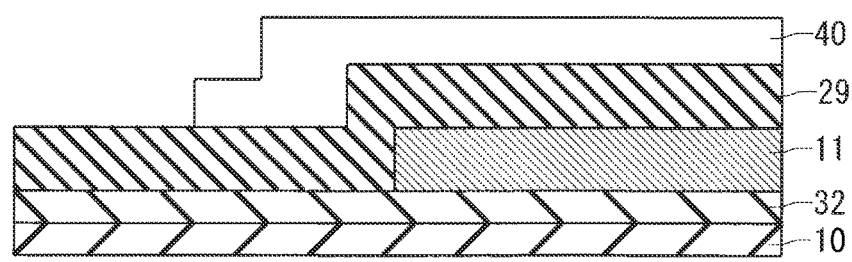
FIG. 35 is a cross-sectional view illustrating a part of the TFT manufacturing method according to the fifth preferred embodiment.

FIG. 34 and FIG. 35 are cross-sectional views illustrating a part of a TFT manufacturing method according to the fifth preferred embodiment. The TFT forming region is mainly described below with reference to FIG. 33 to FIG. 35.

A silicon nitride film, which has comparatively high hydrogen content and satisfies, for example, the condition B1 is formed as an insulating layer 32 on an entire surface of insulating substrate 10. A gate electrode 11 made of a first conductive film is formed on the insulating layer 32.

The gate electrode 11 is covered with, for example, a gate insulating film 29 made of an oxide silicon film. That is to say, the gate insulating film 29 is formed on an entire surface of an insulating film 32 and partially on the gate electrode 11.

The gate insulating film 29 on a region that contacts with the insulating layer 32 becomes an insulating region 293 (a second insulating region) that has high hydrogen content and satisfies, for example, the condition B1, and the gate insulating film 29 on the gate electrode 11 becomes an insulating region 291 (a first insulating region) that has low hydrogen content and satisfies, for example, a condition A. Further, the gate insulating film 29 on an end region of the gate electrode 11 becomes an insulating region (an intermediate insulating region) 292 that has intermediate hydrogen content. In such a manner, the gate insulating film 29 includes the insulating regions 291 to 293 whose hydrogen content varies. A hydrogen related characteristic is such that the hydrogen content of the first insulating region is lower than the hydrogen content of the second insulating region.

Resistance of an oxide semiconductor layer 40 and dispositions of a source electrode 51 and the drain electrode 52 that correspond to the hydrogen contents of the gate insulating film 29 are similar to those in the first to fourth preferred embodiments. An oxide semiconductor region 41 is formed on the insulating region 291 on the oxide semiconductor layer 40, an oxide semiconductor region 42 is formed on the insulating region 292, and an oxide semiconductor region 43 is formed on the insulating region 293. Description about the other parts of the structure is omitted.

A TFT in a state of satisfactory connection between the source electrode 51 and the oxide semiconductor region 43 and between the drain electrode 52 and the oxide semiconductor region 43 can be formed on the source and drain regions only by additional of formation of the insulating layer 32 on a lower surface of the gate electrode 11 to the structure of an amorphous Si-TFT and a change in a film type of the gate insulating film 29. For this reason, the design is enabled by using a database of measures against defects in an amorphous Si-TFT array.

The TFT according to the fifth preferred embodiment having such a structure is formed of a laminated structure of the insulating layer 32 and the gate insulating film 29 in which a region of the forming region of the gate insulating film 29 formed on the gate electrode 11 is the insulating region 291 (the first insulating region), and a region of the forming region of the insulating film 29 formed directly on the insulating layer 32 is the insulating region 293 (the second insulating region). As a result, the first and second effects are produced similarly to the first to fourth preferred embodiments.

At this time, the hydrogen contents of the insulating region 291 (the first insulating region) and the insulating region 293 (the second insulating region) satisfy the condition A and the condition B1.

MODIFIED EXAMPLES

FIG. 36 and FIG. 37 are cross-sectional views illustrating sectional structures according to modified examples of the fifth preferred embodiment. The TFT according to the modified examples of the fifth preferred embodiment is described below with reference to FIG. 36 and FIG. 37.

In a first modified example shown in FIG. 36, the structure of the gate electrode 11B is a laminated structure such that an upper layer is a conductive layer 15 formed of a first conductive film and a lower layer is a hydrogen permeation preventing film 33.

In a second modified example shown in FIG. 37, a structure of the gate electrode 11C is a laminated structure such that an upper layer is a hydrogen permeation preventing film 34 and a lower layer is a conductive layer 16 formed of a first conductive film.

An insulating film such as Al oxide film, an Al nitride film, a Ta oxide film, a Ti oxide film, a Zr oxide film, and an SrTiO$_3$ film is used and a conductive film of Ti nitride film, Ta nitride film, TiSiN, TaSiN, SrRuO$_3$, and IrO$_3$ is used as the hydrogen permeation preventing films 33 and 34. These films have a hydrogen permeation preventing characteristic that satisfies the above condition D, for example.

The use of the first and second modified examples of the fifth preferred embodiment can further reduce the hydrogen content of the insulating region 291 of the gate insulating film 29 on the gate electrode 11 while the connecting state between the source electrode 51 and the oxide semiconductor region 43 and between the drain electrode 52 and the oxide semiconductor region 43 on the source and drain regions is satisfactorily maintained. Further, the high resistance of the oxide semiconductor region 41 serving as the channel region can be maintained so that a satisfactory TFT characteristic can be realized.

That is to say, in the first and second modified examples of the fifth preferred embodiment, the hydrogen permeation preventing films 33 and 34 to be formed as parts of the gate electrodes 11B and 11C securely restrain the hydrogen moving from the insulating layer 32 via the gate electrodes 11B and 11C to the insulating region 291 (a first insulating region). As a result, the oxide semiconductor region 41 serving as the channel region can be set to high resistance with high accuracy.

Sixth Preferred Embodiment

Figure 38:
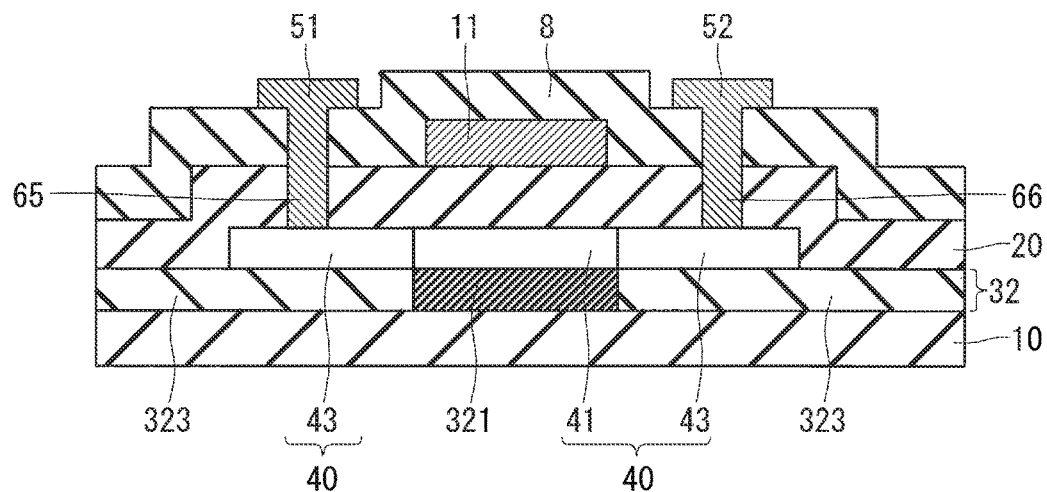
FIG. 38 is a cross-sectional view illustrating a detailed structure of the TFT according to a sixth preferred embodiment of the present invention.

FIG. 38 is a cross-sectional view illustrating a detailed structure of a TFT according to a sixth preferred embodiment of the present invention. In the first to fifth preferred embodiments, the present invention has been described by using an inversely staggered TFT in which a gate electrode is positioned on a lower layer with respect to a semiconductor layer. On the other hand, the TFT shown in FIG. 38 is a top-gate TFT. The following description about the TFT according to the sixth preferred embodiment mainly refers to a TFT forming region.

An insulating layer 32 is formed on an entire surface of an insulating substrate 10. A part of the insulating layer 32 becomes an insulating region 323 (a second insulating region) that has high hydrogen content and satisfies, for example, the condition B1. A region other than this part becomes an insulating region 321 (a first insulating region) that has low hydrogen content and satisfies, for example, the condition A. A hydrogen related characteristic is such that the insulating region 321 (the first insulating region) is lower in the hydrogen content than the insulating region 323 (the second insulating region).

An oxide semiconductor layer 40 is formed on the insulating layer 32, and an oxide semiconductor region 41 (a first oxide semiconductor region) is formed on an insulating region 321 of the oxide semiconductor layer 40. Further, an oxide semiconductor region 43 (a second oxide semiconductor region) is formed on an insulating region 323.

Resistance of the oxide semiconductor layer 40 and dispositions of a source electrode 51 and a drain electrode 52 that correspond to the respective hydrogen contents of the insulating layer 32 are similar to the resistance and the dispositions corresponding to the respective hydrogen contents of the gate insulating film according to the first to fourth preferred embodiments.

A gate insulating film 20 is formed so as to cover the oxide semiconductor layer 40, and a gate electrode 11 made of a first conductive film is formed on the insulating region 321 on the gate insulating film 20 as shown in FIG. 38. Further, an interlayer insulating film 8 is formed so as to cover the gate electrode 11, and the source electrode 51 and the drain electrode 52 are formed on the interlayer insulating film 8. The source electrode 51 and the drain electrode 52 are formed over the insulating region 323 so as to be connected to the oxide semiconductor region 43 via contact holes 65 and 66 opened in the interlayer insulating film 8 and the gate insulating film 20, respectively.

The TFT according to the sixth preferred embodiment having such a structure produces the effects of the present invention similarly to the first to fifth preferred embodiments when a region of a forming region of the insulating layer 32 formed on a lower surface of the gate electrode 11 is the insulating region 321 (the first insulating region), and a region of the forming region of the insulating layer 32 formed on lower surfaces of the source electrode 51 and the drain electrode 52 is the insulating region 323 (the second insulating region).

A method for forming the insulating region 321 and the insulating region 323 is such that after the insulating layer 32 that contains the low amount of hydrogen is formed, hydrogen atoms may be injected into only the insulating region 323.

After an insulating layer that has low hydrogen content is formed, only the insulating region 321 is allowed to remain through patterning. An insulating film that has high hydrogen content is formed, and the insulating film having the high hydrogen content is processed so that the insulating region 321 is exposed. In such a manner, the insulating region 323 may be formed. Patterning using etching lift-off or flattening through CMP may be performed as the process.

On the contrary, the insulating film having high hydrogen content is formed first, and a portion to be the insulating region 323 is allowed to remain through patterning. Thereafter, the insulating film having low hydrogen content may be formed.

First Modified Example

Figure 39:
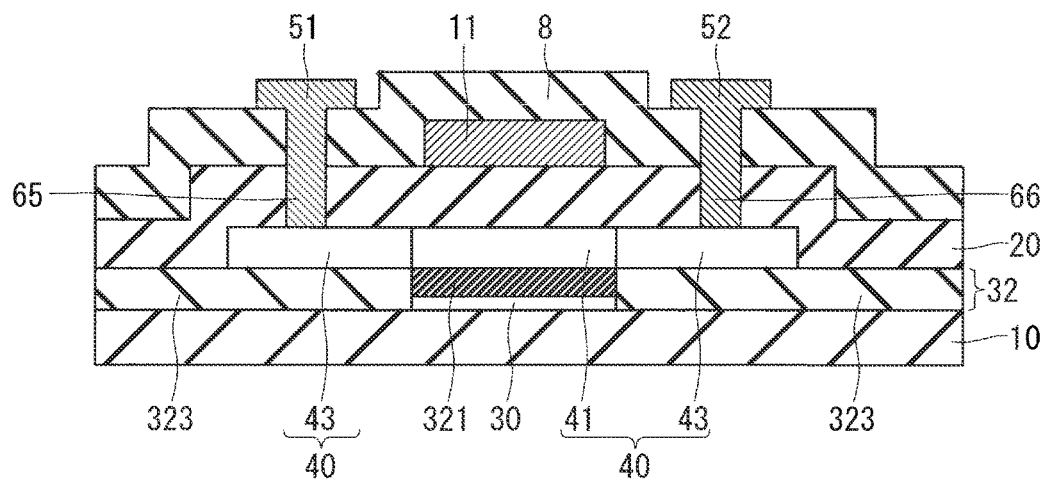
FIG. 39 is a cross-sectional view illustrating a sectional structure according to a first modified example of the sixth preferred embodiment.

FIG. 39 is a cross-sectional view illustrating a cross-sectional structure according to a first modified example of the sixth preferred embodiment. A hydrogen absorbing film 30 is patterned and formed on a portion corresponding to the insulating region 321 in advance, and then the insulating layer 32 having high hydrogen content may be formed as shown in FIG. 39. In this case, the hydrogen content in the respective insulating regions can be set by the effect similar to the effect in the third preferred embodiment.

Second Modified Example

FIG. 40 is a cross-sectional view illustrating a sectional structure according to a second modified example of the sixth preferred embodiment. The TFT according to the modified example of the sixth preferred embodiment is described below with reference to FIG. 40.

In the modified example shown in FIG. 40, a hydrogen permeation preventing film 33 that has low hydrogen permeability and satisfies, for example, the condition D is formed on a lower layer of an oxide semiconductor region 41 (a first oxide semiconductor region) of the oxide semiconductor layer 40 on an upper layer of the insulating layer 32. Further, the hydrogen permeation preventing film 33 is formed on a lower surface of the gate electrode 11. A hydrogen content of the hydrogen permeation preventing film 33 is set so as to be sufficiently lower than the hydrogen content of the insulating layer 32.

In the modified example of the sixth preferred embodiment, presence of the hydrogen permeation preventing film 33 securely restrains the hydrogen from moving from the insulating layer 32 to the oxide semiconductor region 41 (the first oxide semiconductor region), so that the oxide semiconductor region 41 serving as the channel region can be set to high resistance with high accuracy.

(Others)

An array substrate for TN liquid crystal display having the TFT according to the first to sixth preferred embodiments produces the effect similar to the effects in the first to sixth preferred embodiments.

The preferred embodiments of the present invention describe the structure where both the source electrode and the drain electrode are formed on the second oxide semiconductor region. However, for example, when a drain electrode and a pixel electrode are formed integrally on an oxide semiconductor layer and only a source electrode is formed on a second oxide semiconductor region, the effects of the present invention can be produced also in this structure. Further, when the present invention is applied to at least only one of the source electrode and the drain electrode, the similar effect can be produced in an applicable range.

In the present invention, the respective preferred embodiments can be freely combined, suitably modified and omitted within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor comprising:
   a gate electrode formed over an insulating substrate, said gate electrode being the only gate electrode included in said thin film transistor;
   a gate insulating film formed over said insulating substrate and at least a part of said gate electrode;
   an oxide semiconductor layer formed on said gate insulating film; and
   a source electrode formed on said oxide semiconductor layer, wherein
   said gate insulating film includes
     a first insulating region formed on said gate electrode, and
     a second insulating region formed over said insulating substrate without interposing said gate electrode therebetween and being different in hydrogen content from hydrogen content of said first insulating region,
   said oxide semiconductor layer includes
     a first oxide semiconductor region formed on said first insulating region and at least having a channel region, and
     a second oxide semiconductor region formed on said second insulating region and connected to said source electrode,
   said source electrode does not overlap with said gate electrode in a plan view and is separated from said gate electrode in a horizontal direction,
   said first oxide semiconductor region is higher in resistance than resistance of said second oxide semiconductor region,
   said gate insulating film includes
     a first gate insulating film formed on said insulating substrate and on an entire surface of said gate electrode,
     a second gate insulating film selectively formed on said first gate insulating film, and said second gate insulating film is formed so as to extend over said insulating substrate through an end of said gate electrode via said first gate insulating film, hydrogen content of said second gate insulating film is higher than hydrogen content of said first gate insulating film, and
     a forming region of said first gate insulating film excluding an insulating laminated region where said first and second gate insulating films are laminated is said first insulating region, and a region of a forming region of said second gate insulating film formed on said first gate insulating film formed on said insulating substrate is said second insulating region, the hydrogen content of said first insulating region is lower than the hydrogen content of said second insulating region, an end region of said second gate insulating film over said gate electrode has a tapered region whose film thickness becomes thinner toward an end of said second gate insulating film, and said tapered region is defined as an intermediate insulating region, said tapered region being provided on top of said first gate insulating film, said oxide semiconductor layer further includes an intermediate oxide semiconductor region formed on said intermediate insulating region, and said intermediate oxide semiconductor region is formed on said intermediate insulating region, and resistance of said intermediate oxide semiconductor region is set so as to be lower than the resistance of said first oxide semiconductor region and is higher than the resistance of said second oxide semiconductor region.

2. The thin film transistor according to claim 1, wherein the hydrogen content of said first insulating region is 0.2 (at %) or less, the hydrogen content of said second insulating region is within a range of 10 to 35 (at %), sheet resistance of said first oxide semiconductor region is 50 M ($\Omega$/sq) or more, and sheet resistance of said second oxide semiconductor region is within a range of 10 to 50 M ($\Omega$/sq).

3. An array substrate comprising the thin film transistor according to claim 1.

4. A thin film transistor comprising:

a gate electrode formed over an insulating substrate, said gate electrode being the only gate electrode included in said thin film transistor;

a gate insulating film formed over said insulating substrate and at least a part of said gate electrode;

an oxide semiconductor layer formed on said gate insulating film; and a source electrode formed on said oxide semiconductor layer, wherein said gate insulating film includes a first insulating region formed on said gate electrode, and a second insulating region formed over said insulating substrate without interposing said gate electrode therebetween and being different in hydrogen content from hydrogen content of said first insulating region, said oxide semiconductor layer includes a first oxide semiconductor region formed on said first insulating region and at least having a channel region, and a second oxide semiconductor region formed on said second insulating region and connected to said source electrode, said source electrode does not overlap with said gate electrode in a plan view and is separated from said gate electrode in a horizontal direction, and said first oxide semiconductor region is higher in resistance than resistance of said second oxide semiconductor region, wherein said gate insulating film includes a first gate insulating film formed only on said gate electrode, and a second gate insulating film formed so as to extend from said insulating substrate onto an end of said first gate insulating film, and being larger in hydrogen content than hydrogen content of said first gate insulating film, a forming region of said first gate insulating film excluding an insulating laminated region where said first and second gate insulating films are laminated is said first insulating region, a forming region of said second gate insulating film excluding said insulating laminated region is said second insulating region, the hydrogen content of said first insulating region is lower than the hydrogen content of said second insulating region, an end region of said second gate insulating film over said gate electrode has a tapered region whose film thickness becomes thinner toward an end of said second gate insulating film, and said tapered region is defined as an intermediate insulating region, said tapered region being provided on top of said first gate insulating film, said oxide semiconductor layer further includes an intermediate oxide semiconductor region formed on said intermediate insulating region, and said intermediate oxide semiconductor region is formed on said intermediate insulating region, and resistance of said intermediate oxide semiconductor region is set so as to be lower than the resistance of said first oxide semiconductor region and is higher than the resistance of said second oxide semiconductor region.

5. The thin film transistor according to claim 4, wherein the hydrogen content of said first insulating region is 0.2 (at %) or less, the hydrogen content of said second insulating region is within a range of 10 to 35 (at %), sheet resistance of said first oxide semiconductor region is 50 M ($\Omega$/sq) or more, and sheet resistance of said second oxide semiconductor region is within a range of 10 to 50 M ($\Omega$/sq).

6. An array substrate comprising the thin film transistor according to claim 4.

* * * * *